United States Patent
Sato

(10) Patent No.: US 7,809,095 B2
(45) Date of Patent: Oct. 5, 2010

(54) WIRELESS RECEIVING APPARATUS AND WIRELESS RECEIVING METHOD

(75) Inventor: Kazumi Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 539 days.

(21) Appl. No.: 11/873,109

(22) Filed: Oct. 16, 2007

(65) Prior Publication Data

US 2008/0279315 A1    Nov. 13, 2008

(30) Foreign Application Priority Data

Oct. 16, 2006   (JP) .............................. 2006-281836

(51) Int. Cl.
*H04L 27/08* (2006.01)
(52) U.S. Cl. ........................................ 375/347; 375/345
(58) Field of Classification Search ................. 375/147, 375/345, 267
See application file for complete search history.

(56) References Cited

U.S. PATENT DOCUMENTS

| | | | |
|---|---|---|---|
| 6,700,865 B1 * | 3/2004 | Yamamoto et al. | 370/208 |
| 7,251,503 B2 * | 7/2007 | Shirakata et al. | 455/562.1 |
| 2004/0235421 A1 * | 11/2004 | Matsuoka et al. | 455/63.4 |
| 2005/0163081 A1 | 7/2005 | Aoki et al. | |
| 2005/0208897 A1 * | 9/2005 | Lyons et al. | 455/67.11 |
| 2006/0007891 A1 | 1/2006 | Aoki et al. | |
| 2007/0109170 A1 | 5/2007 | Mori et al. | |
| 2008/0051046 A1 * | 2/2008 | Ruckriem | 455/132 |

FOREIGN PATENT DOCUMENTS

JP    2000-224086    8/2000

* cited by examiner

*Primary Examiner*—Kevin Y Kim
(74) *Attorney, Agent, or Firm*—Kimble Intellectual Property Law, PLLC

(57) ABSTRACT

According to an aspect of the invention, there is provided a wireless receiving apparatus including: antennas; antenna branches each capable of receiving a wireless signal; a demodulating unit demodulating a reception signal; an antenna selecting unit selecting a packet waiting antenna; a packet detecting unit detecting a packet; a power supply control unit stopping power to a packet non-waiting antenna branch except for the antenna branch connected to a packet waiting antenna until the packet is detected and supplying power to the antenna branches after the packet is detected; a calculating unit calculating a gain value of VGA unit based upon the reception signal via the packet waiting antenna; and a control unit controlling a gain of the VGA unit based upon the calculated gain value after the packet non-waiting antenna branch is initiated when power to the antenna branches is supplied.

13 Claims, 15 Drawing Sheets

WIRELESS RECEIVING APPARATUS AND WIRELESS RECEIVING METHOD

CROSS-REFERENCE TO RELATED APPLICATIONS

This application is based on and claims the benefit of priority from the prior Japanese Patent Application No. 2006-281836, filed on Oct. 16, 2006; the entire contents of which are incorporated herein by reference.

TECHNICAL FIELD

The present invention is related to a wireless receiving apparatus and a wireless receiving method.

BACKGROUND

Description of the Related Art

In wireless communication systems, the diversity reception system has been practically utilized in order to improve reception performance, while a wireless receiving apparatus is equipped with a plurality of antenna branches in the diversity reception system. Also, in order to improve transfer speeds, there are provided the MIMO (Multiple-Input Multiple-Output) system and the like. In the MIMO system, a wireless transmitting apparatus transmits a plurality of signals different from each other from a plurality of antenna branches, and then, a wireless receiving apparatus having a plurality of antenna branches performs a signal separating process operation so as to demodulate the respective received signals. In these systems, the wireless receiving apparatuses require the plural sets of antenna branches.

In such a CSMA (Carrier Sense Multiple Access) packet transferring system as a wireless LAN (Local Area Network), during waiting time for waiting arrivals of packets, electric power is consumed irrespective of non-execution of transmitting/receiving process operations, since the CSMA packet transferring system continuously performs packet detecting process operation for judging whether or not packets are received.

As a consequence, if a wireless receiving apparatus having a plurality of branch antennas executes packet detecting process operations with respect to all of these antenna branches, then a huge amount of electric power is consumed.

Under these circumstances, it is disclosed by, for example JP-A-2000-224086, that a diversity reception method for performing a packet detecting process operation based upon a single antenna branch has been proposed. In this diversity reception method, a packet detecting process operation during packet waiting time is carried out by always employing one antenna branch, while the plurality of antenna branches are switched in a periodic manner.

In the above-described diversity reception method, since the packet detecting process operation is carried out based upon one antenna branch within the plural antenna branches, lower power consumption during packet waiting time may be realized. If a packet is detected by such an antenna branch while a packet detecting process operation is being performed, then the remaining antenna branches are initiated and reception signals received by all of these antenna branches are demodulated respectively.

As previously described, this diversity reception method is featured as follows: That is, the lower power consumption during the packet receiving time is realized by performing the packet detecting process operation based upon one antenna branch, and further, after the packet has been detected, all of the antenna branches are initiated, and then, the signals received by all of the antenna branches are selected, or synthesized with each other so as to demodulate the reception signals. As a result, even when a packet is waited by a single antenna packet, a reception characteristic may be improved.

However, since a lengthy time is required in order to initiate antenna branches, in such systems typically known as IEEE 802.11a and IEEE 802.11n, to which very short preambles have been applied, the below-mentioned problem occurs. That is, in these systems, the initiations of the antenna branches and executions of gain controlling process operations cannot be accomplished only for a preamble time period, so that demodulating process operations cannot be carried out just in time. Also, since the gain controlling process operations cannot be accomplished within the preamble time period, there is another problem. That is, reception signals cannot be properly adjusted in dynamic ranges of A/D converters, so that reception performance is deteriorated.

As previously described, in accordance with the conventional diversity reception methods, since a lengthy time is required until the antenna branches are initiated after the packet is detected in the system to which the very short preamble has been applied, the gain controlling process operation cannot be carried out just in time during the preamble time period, so that the reception signals cannot be properly adjusted in the dynamic ranges of the A/D converters.

SUMMARY

According to an aspect of the invention, there is provided a wireless receiving apparatus including: a plurality of antennas; a plurality of antenna branches connected to the plurality of corresponding antennas each antenna branch capable of receiving a wireless signal and comprising a variable gain amplifying unit; a demodulating unit demodulating a reception signal outputted from the antenna branches; an antenna selecting unit selecting a packet waiting antenna from the plurality of antennas based upon reception power of the reception signal; a packet detecting unit detecting a packet received via the packet waiting antenna; a power supply control unit stopping a supply of electric power to a packet non-waiting antenna branch except for the antenna branch connected to the packet waiting antenna until the packet detecting unit detects the packet and supplying electric power to the plurality of antenna branches after the packet detecting unit detects the packet; a gain value calculating unit calculating a gain value of the variable gain amplifying unit based upon the reception signal received via the packet waiting antenna; and a gain value output control unit controlling a gain of the variable gain amplifying unit based upon the gain value calculated by the gain value calculating unit after the packet non-waiting antenna branch is initiated when the power supply control unit supplies the electric power to the plurality of antenna branches.

According to another aspect of the invention, there is provided a wireless receiving apparatus, including: a plurality of antennas; a plurality of antenna branches connected to the plurality of antennas corresponding thereto each antenna branch capable of receiving a wireless signal and comprising a variable gain amplifying unit; an antenna selecting unit selecting a packet waiting antenna from the plurality of antennas based upon reception power of the reception signal outputted from the plurality of antenna branches; a packet detecting unit detecting a packet received via the packet waiting antenna, the packet comprising a first section receivable by one of the plurality of antennas, a second section receivable by the plurality of antennas, and a section capable of controlling a gain of the plurality of antenna branches; a demodulating unit demodulating a reception signal outputted from the plurality of antenna branches within the first section and the second section; a power supply control unit stopping a supply of electric power to a packet non-waiting antenna branch except for the antenna branch connected to the packet waiting antenna until the packet detecting unit detects the packet and supplying the electric power to the plurality of antenna branches after the packet detecting unit detects the packet; a first gain value calculating unit calculating a gain value of the variable gain amplifying unit of the antenna branch based upon the reception signal received via the packet waiting antenna; a first gain value output control unit controlling a gain of the variable gain amplifying unit by employing the gain value calculated by the first gain value calculating unit after the packet non-waiting is initiated when the power supply control unit supplies the electric power to the plurality of antenna branches; a second gain value calculating unit calculating the gain value of the variable gain amplifying unit based upon the reception signal received via the plurality of antennas; and a second gain value output control unit controlling the gain value of the variable gain amplifying unit by employing the gain value calculated by the second gain value calculating unit within a third section during which the gain of the plurality of antenna branches of the wireless packet can be controlled.

According to another aspect of the invention, there is provided a wireless receiving method including: amplifying a reception signal which is received via a plurality of antennas by a plurality of antenna branches; selecting a packet waiting antenna from the plurality of antennas based upon reception power of the reception signal outputted from the plurality of antenna branches; stopping a supply of electric power to a packet non-waiting antenna branch except for a packet waiting antenna branch connected to the packet waiting antenna; detecting a packet from the reception signal received via the packet waiting antenna; supplying electric power of a power supply to the plurality of antenna branches after the packet is detected; calculating a gain value of a variable gain amplifying unit of at least one of the plurality of antenna branches based upon the reception signal received via the packet waiting antenna; and controlling a gain of the variable gain amplifying unit based upon the calculated gain value after the packet non-waiting antenna branch is initiated when the electric power is supplied to the plurality of antenna branches.

According to another aspect of the invention, there is provided a wireless receiving method including: amplifying a reception signal which is received via a plurality of antennas by a plurality of antenna branches; selecting a packet waiting antenna from the plurality of antennas based upon reception power of the reception signal outputted from the plurality of antenna branches; stopping a supply of electric power to a packet non-waiting antenna branch except for a packet waiting antenna branch connected to the packet waiting antenna; detecting a packet from the reception signal received via the packet waiting antenna; supplying electric power of a power supply to the plurality of antenna branches after the packet is detected; calculating a gain value of a variable gain amplifying unit of at least one of the plurality of antenna branches based upon the reception signal received via the packet waiting antenna; controlling the gain of the variable gain amplifying unit based upon the calculated gain value after the packet non-waiting antenna branch is initiated when the electric power is supplied to the plurality of antenna branches; demodulating the reception signal outputted from the plurality of antenna branches after the gain of the variable gain amplifying unit is controlled; calculating the gain value of the variable gain amplifying unit of the antenna branches based upon the reception signal of the plurality of antennas after the reception signal is demodulated; controlling the gain of the variable gain amplifying unit based upon the calculated gain value; and demodulating the reception signal outputted from the plurality of antenna branches after the gain of the variable gain amplifying unit is controlled.

DESCRIPTION OF THE EMBODIMENTS

Referring now to drawings, a description is made of embodiments of the present invention.

First Embodiment

Referring now to FIG. 1 to FIG. 4, a description is made of a wireless receiving apparatus according to a first embodiment of the present invention.

Figure 1:
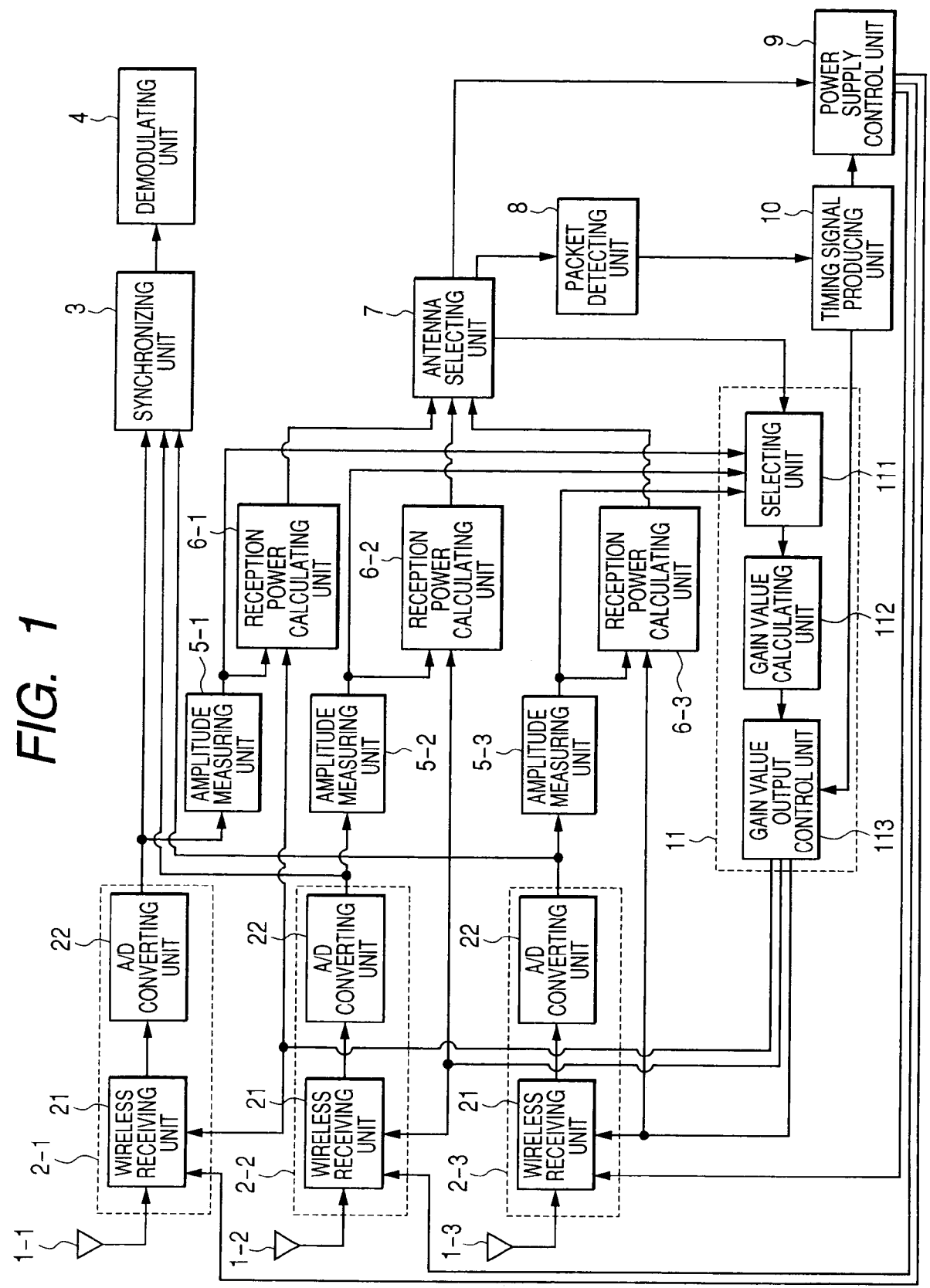
FIG. 1 is an exemplary block diagram for showing an arrangement of a wireless receiving apparatus according to a first embodiment of the present invention.

FIG. 1 is a block diagram for showing an arrangement of the wireless receiving apparatus according to this first embodiment. Although the first embodiment describes that a total number of antenna branches is selected to be 3, two, or more sets of antenna branches may be sufficiently employed in this wireless receiving apparatus. It should be understood that in the first embodiment, such a case that the wireless receiving apparatus receives a packet will be referred to as a "packet receiving mode", whereas such a case that the wireless receiving apparatus does not receive a packet will be is referred to as a "packet waiting mode."

The wireless receiving apparatus indicated in FIG. 1 has been provided with antennas 1-1 to 1-3; antenna branches 2-1 to 2-3; a synchronizing unit 3, a demodulating unit 4; amplitude measuring units 5-1 to 5-3; reception power calculating units 6-1 to 6-3; an antenna selecting unit 7; a packet detecting unit 8; a power supply control unit 9; a timing signal producing unit 10; and also, a gain value processing unit 11. The antennas 1-1 to 1-3 receive signals. The antenna branches 2-1 to 2-3 contain wireless receiving units 21 and A/D converting units 22. The synchronizing unit 3 performs a timing synchronizing process operation, a frequency synchronizing process operation, and the like. The demodulating unit 4 demodulates reception signals so as to obtain a data stream. The amplitude measuring units 5-1 to 5-3 measure averaged amplitude values of the reception signals. The reception power calculating units 6-1 to 6-3 calculate reception electric power. The antenna selecting unit 7 selects such an antenna branch that a power supply is turned ON during a packet waiting mode. The packet detecting unit 8 detects a packet from the reception signals. The power supply control unit 9 controls turning ON/OFF of the power supplies of the antenna branches 2-1 to 2-3. The timing signal producing unit 10 produces operation timing signals for the power supply controlling unit 9, and for the gain value producing unit 11. The gain value producing unit 11 contains a selecting unit 111, a gain value calculating unit 112, and a gain value output control unit 113.

Subsequently, a detailed description is made of the respective units of the wireless receiving apparatus.

The antenna branches 2-1 to 2-3 convert signals received via the antennas 1-1 to 1-3 from analog signals to digital signals, and then, output the converted digital signals to the synchronizing unit 3 and the amplitude measuring units 5-1 to 5-3 corresponding thereto. It should be noted that the wireless receiving unit 21 included in the antenna branch 2-1 will be later described in detail with reference to FIG. 2.

In this example, two sets of antenna branches within the antenna branches 2-1 to 2-3 turn OFF the power supplies thereof during packet waiting modes in response to an output signal (will be discussed later) of the power supply control unit 9. On the other hand, during packet reception modes, the power supplies of all of the antenna branches 2-1 to 2-3 are turned ON. As a consequence, such an antenna corresponding to an antenna branch whose power supply is under ON condition during packet waiting mode will be referred to as a "packet waiting antenna", whereas such an antenna corresponding to an antenna branch whose power supply is under OFF condition during packet waiting mode will be referred to as a "packet non-waiting antenna."

In this case, in order to turn OFF a power supply of an antenna branch, a power supply supplied to the antenna branch may be brought into such a condition that the supply of the electric power is completely stopped. Alternatively, the power supply may be brought into such a rest condition that a current slightly flows, or brought into a standby condition.

Next, the synchronizing unit 3 performs synchronizing process operations such as a timing synchronization and a frequency synchronization with respect to reception signals inputted from the antenna branches 2-1 to 2-3, and then, outputs a result of the synchronizing operation to the demodulating unit 4. The demodulating unit 4 performs a demodulating process operation based upon the synchronizing process result entered from the synchronizing unit 3 so as to demodulate the reception signals to obtain a data stream.

The amplitude measuring units 5-1 to 5-3 measure averaged amplitude values of the reception signals entered from the corresponding antenna branches 2-1 to 2-3, and then, outputs measurement results to both the corresponding reception power calculating units 6-1 to 6-3, and the selecting unit 111 which is included in the gain value producing unit 11.

The reception power calculating units 6-1 to 6-3 into which the averaged amplitude values are entered from the respective amplitude measuring units 5-1 to 5-3 calculate reception power based upon the averaged amplitude values and gain controlling values, and then, output calculation results to the antenna selecting unit 7.

The antenna selecting unit 7 selects a "packet waiting antenna" based upon the reception power inputted from the reception power calculating units 6-1 to 6-3, and then, outputs a selection result to the power supply control unit 9 and the selecting unit 11 of the gain value generating unit 11, and also, outputs reception power of a signal received by the selected antenna to the packet detecting unit 8. Also, while the antenna selecting unit 7 has stored thereinto the selected antenna as the packet waiting antenna, the antenna selecting unit 7 notifies the antenna under storage to the selecting unit 111 during the packet waiting mode, and also, outputs reception power of a signal received by the antenna under storage to the packet detecting unit 8.

When the packet waiting antenna is selected based upon the reception power, the antenna selecting unit 7 may alternatively select such an antenna that the reception power entered from the respective reception power calculating units 6-1 to 6-3 becomes maximum. In such a case that there is no large difference in the reception power calculated by the respective reception power calculating units 6-1 to 6-3, the antenna selecting unit 7 may alternatively select an arbitrary antenna. Alternatively, the antenna selecting unit 7 may select an antenna which receives such a signal of reception power that a distortion and a noise characteristic as to the wireless receiving units 21 included in the antenna branches 2-1 to 2-3 become minimum. Otherwise, in the case that distortions and noise characteristics as to the wireless receiving units 21 of the antenna branches 2-1 to 2-3 have been previously measured, while a relationship among the distortions, the noise characteristics, and the reception power may be previously stored in the antenna selecting unit 7, the antenna selecting unit 7 may alternatively select a packet waiting antenna in accordance with the relationship stored in the antenna selecting unit 7.

The reception power of the signal received by the packet waiting antenna is inputted from the antenna selecting unit 7 to the packet detecting unit 8. The packet detecting unit 8 detects a packet based upon this reception power, and when the packet is detected, the packet detecting unit 8 notifies a packet detection result to the timing signal producing unit 10.

When such a notification that the packet is detected is issued from the packet detecting unit 8, the timing signal producing unit 10 outputs a start timing signal to both the power supply control unit 9 and the gain value output control unit 113. Also, although not shown in the drawing, packet length information is entered to the timing signal producing unit 10. The timing signal producing unit 10 outputs an end timing signal based upon the entered packet length information at timing when the reception of the packet is ended.

The power supply control unit 9 produces a control signal based upon the antenna selection result during the packet waiting operation entered from the antenna selecting unit 8, while the control signal turns OFF a power supply of an antenna branch corresponding to a non-selected antenna (namely non-waiting antenna). When the end timing signal is inputted from the timing signal producing unit 10, the power supply control unit 9 outputs the produced control signals to the respective antenna branches 2-1 to 2-3. Also, when the start timing signal is inputted from the timing signal producing unit 10, the power supply control unit 9 produces control signals for turning ON all of the power supplies of these antenna branches 2-1 to 2-3, and then, outputs the produced control signals to the respective antenna branches 2-1 to 2-3.

The gain value producing unit 1 contains the selecting unit 111, the gain value calculating unit 112, and the gain value output control unit 113. The gain value producing unit 11 produces such gain control values which control the reception signals outputted from the respective wireless receiving unit 21 to have suitable amplitudes for the dynamic ranges of the A/D converting units 22.

Both the averaged amplitude values of the signals received by the respective antennas 1-1 to 1-3 are notified from the amplitude measuring units 5-1 to 5-3, and the packet waiting antenna is notified from the antenna selecting unit 7 to the selecting unit 111. As a consequence, the selecting unit 111 selects such an averaged amplitude value of a signal received by the packet waiting antenna, and then, outputs the selected averaged amplitude value to the gain value calculating unit 112.

The gain value calculating unit 112 calculates a difference between an amplitude value suitable for a demodulating process operation and the averaged amplitude value inputted from the selecting unit 111, and produces a proper gain control value by referring to a table which has previously stored gain values with respect to differences, and then, outputs the produced proper gain control value. Alternatively, such a relative formula between the differences and the gain values may be previously stored in this table instead of the above-described table contents, namely, all of the relationship between the differences and the gain values have been previously stored.

The gain value output control unit 113 outputs the gain control values entered from the gain value calculating unit 111 as gain control signals to the respective wireless receiving units 21 in response to the start timing signal inputted from the timing signal producing unit 10. It should be noted that the output timing of the gain value control signals will be explained later.

Subsequently, a detailed description is made of the wireless receiving unit 21 having the antenna branch 2-1 with reference to FIG. 2. In this case, although the wireless receiving unit 21 included in the antenna branch 2-1 will now be described, a similar explanation may be applied to the wireless receiving unit 22 included in the antenna branches 2-2 and 2-3.

The wireless receiving unit 21 has included a filter 212, an LNA (Low Noise Amplifier) 213, an orthogonal demodulator 214, baseband filters 215-1, and 215-2, and also, VGAs (Variable Gain Amplifiers) 216-1 and 216-2. The filter 212 suppresses outside-band interference components of an entered RF signal. The orthogonal demodulator 214 converts the RF signal into an I-phase baseband signal and a Q-phase baseband signal with employment of a local oscillator 217. The baseband filters 215-1 and 215-2 suppress outside band components of the I-phase and Q-phase baseband signals. The VGAs 216-1 and 216-2 amplify the inputted signals.

The filter 212 suppresses the outside-band interference component of the RF signal received via the antenna 1-1, and then, outputs the interference-suppressed RF signal to the LNA 213. The LNA 213 amplifies the RF signal passed through the filter 212, and outputs the amplified RF signal to the orthogonal demodulator 214. At this time, the LNA 213 may be alternatively arranged in such a manner that the gain thereof is changed in response to the signal outputted from the gain value producing unit 11.

The orthogonal demodulator 214 converts the RF signal entered from the LNA 213 into the I-phase baseband signal and the Q-phase baseband signal based upon the local oscillator 217, and then, outputs the I-phase baseband signal to the baseband filter 215-1 and outputs the Q-phase baseband signal to the baseband filter 215-2. In this case, the direct conversion system for directly converting the RF signal into the baseband signals has been applied. Alternatively, a superheterodyne system for converting an RF signal into baseband signals in two stages may be applied. Furthermore, another system may be alternatively applied by which the RF signal is not converted into the baseband signals by the wireless receiving unit 21, but is converted into IF (Intermediate Frequency) signals, and the IF signals are converted into corresponding digital signals by the A/D converting unit 22, and thereafter, the digital signals are converted into baseband signals based upon a digital signal processing operation.

The baseband filters 215-1 and 215-2 suppress outside band components of the I-phase baseband signal and of the Q-phase baseband signal entered from the orthogonal demodulator 214, and then, output the suppressed baseband signals to the VGAs 216-1 and 216-2. The VGAs 216-1 and 216-2 amplify the baseband signals passed through the baseband filters 215-1 and 215-2 respectively, and then, output the amplified baseband signals to the A/D converting unit 22. At this time, the gains of the VGAs 216-1 and 216-2 are controlled in response to the gain control signals outputted by the gain value producing unit 11.

Subsequently, a description is made of operations of the wireless receiving apparatus according to the first embodiment with reference to FIG. 1 to FIG. 4. It should be understood that in this example, the following description is made of such a case that the antenna 1-1 corresponds to the "packet waiting antenna." A similar description may be alternatively applied to such a case that the antennas 1-2 and 1-3 correspond to the "packet waiting antenna." FIG. 3 is a flow chart for explaining an operation flow of the wireless receiving apparatus according to the first embodiment.

Firstly, when the wireless receiving apparatus is operated in the packet waiting mode, the power supply of the antenna branch 2-1 connected to the antenna 1-1 is under ON status. On the other hand, the power supplies of the antenna branches 2-2 and 2-3 are under OFF statuses (step S101). Next, the wireless receiving apparatus judges whether or not the packet detecting unit 8 detects a packet based upon a signal received by the antenna 1-1 (step S102).

When the packet detecting unit 8 does not detect the packet ("NO" in step S102), the process operation of the wireless receiving apparatus is returned to the previous step S101 in which a packet via the antenna 1-1 is waited. On the other hand, when the packet detecting unit 8 detects the packet ("YES" in step S102), the operation mode of the wireless receiving apparatus is switched from the packet waiting mode to a packet receiving mode, and thus, the timing signal producing unit 10 outputs a start timing signal to the power control unit 9 and the gain value output control unit 113. The power control unit 9 which has received the start timing signal outputs a control signal for turning ON the power supplies of the antenna branches 2-2 and 2-3 (step S103).

While the antenna branches 2-2 and 2-3 are initiated, the amplitude measuring unit 5-1 measures an averaged amplitude value (step S104). Next, the gain value producing unit 11 calculates a gain control value based upon the averaged amplitude value measured by the amplitude measuring unit 5-1, and the wireless receiving apparatus judges whether or not an optimum gain control value is calculated by this calculation (step S105). In the case that the optimum gain control value is not calculated ("NO" in step S105), the process operation of the wireless receiving apparatus is returned to the step S104 in which an averaged amplitude value of the antenna 1-1 is measured. In this example, the wireless receiving apparatus judges whether or not the optimum gain value is calculated. Alternatively, the calculation of the gain control value may be repeatedly carried out only by a previously determined time.

On the other hand, when the optimum gain control value is calculated ("YES" in step S105), the wireless receiving apparatus judges whether or not the antenna branches 2-2 and 2-3 have been initiated (step S106). If the antenna branches 2-2 and 2-3 have not yet been initiated ("NO" in step S106), the wireless receiving apparatus waits until the antenna branches 2-2 and 2-3 are initiated. To the contrary, if the antenna branches 2-2 and 2-3 have been initiated ("YES" in step S106), then the gain values of the VGAs 216-1 and 216-2 included in all of the wireless receiving units 21 are controlled by employing the gain control value calculated in the step S105 (step S107).

After the gain control operation is accomplished, a synchronizing process operation is carried out by the synchronizing unit 3 (step S108), and subsequently, a demodulating process operation of the reception signal is carried out by the demodulating unit 4 (step S109). The demodulating unit 4 performs the demodulating process operation in the step S109 until the reception of the packet is accomplished ("NO" in step S110). When the reception of the packet is accomplished ("YES" of step S110), the antenna selecting unit 7 selects a packet waiting antenna, and the wireless receiving apparatus is brought into the packet waiting mode until a next packet is detected.

Subsequently, a description is made of operation timing of the wireless receiving apparatus when a packet is received with reference to FIG. 4. Firstly, an upper stage of FIG. 4 indicates a structural example of a packet which is received by the wireless receiving apparatus according to the first embodiment. In this case, the upper stage shows the structural example of the packet in conformity to the draft (Version 1.0) of IEEE 802.11n.

The packet contains an L-STF section positioned at a head thereof, an HT-LTF1 section, an HT-SIG section, an HT-LTF2 to an HT-LTFn sections, and finally, a DATA section corresponding to a data stream. The L-STF section is employed in a gain control and a synchronizing process operation. The HT-LTF1 section is employed in a transfer path response assumption. The HT-SIG section corresponds to a header information portion. The HT-LTF2 to HT-LTFn (symbol "n" indicates stream number, and is determined by communication system) sections are employed in a transfer path response assumption.

Subsequently, a description is made of operation timing of the wireless receiving apparatus when a packet is received. A middle stage of FIG. 4 represents operation timing of the respective units corresponding to the antenna 1-1 constituting the packet waiting antenna, such as the antenna branch 2-1 and the like. A lower stage of FIG. 4 shows operation timing of the respective units corresponding to the packet non-waiting antennas 1-2 and 1-3.

Figure 4:
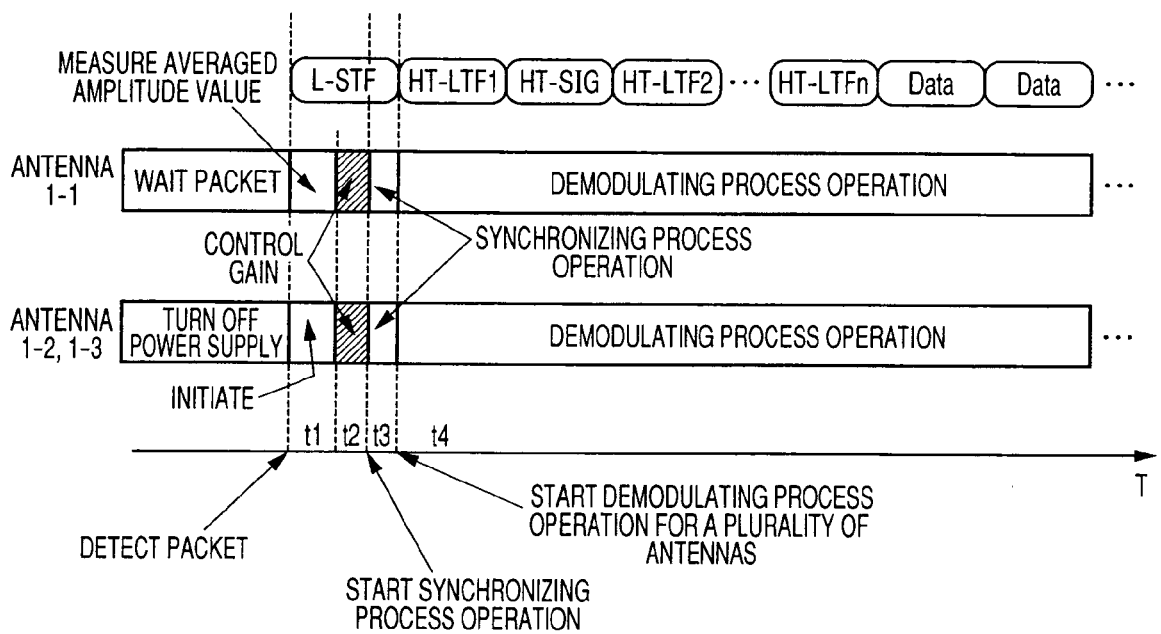
FIG. 4 is an exemplary diagram for representing operation timing of the wireless receiving apparatus when a packet is received, according to the first embodiment.

As to the antenna branch 2-1 corresponding to the packet waiting antenna 1-1 shown in the middle stage of FIG. 4, the power supply thereof has been turned ON during the packet waiting mode until the packet detecting unit 8 detects a packet, so that a signal is being received by this antenna branch 2-1. On the other hand, the power supplies of the antenna branches 2-2 and 2-3 corresponding to the packet non-waiting antennas 1-2 and 1-3 shown in the lower stage of FIG. 4 have been turned OFF during the packet waiting mode.

Next, if the packet detecting unit 8 detects the packet and thus the operation mode is switched from the packet waiting mode to the packet receiving mode, then the amplitude measuring unit 5-1 calculates an averaged amplitude value of the reception signal of the packet waiting antenna 1-1 and the gain value producing unit 11 calculates a gain control value based upon the averaged amplitude value for a time "t1" of the L-STF section at the head of the packet. On the other hand, the antenna branches 2-2 and 2-3 corresponding to the packet non-waiting antennas are initiated for the time "t1" upon receipt of the control signal supplied from the power supply control unit 9.

After the antenna branches 2-2 and 2-3 have been initiated, the gain value producing unit 11 performs gain control operations of the VGAs 216-1 and 216-2 by employing the calculated gain control value. After the gain value producing unit 11 has performed the gain control operation for a time "t2", the synchronizing unit 3 performs a synchronizing process operation based upon reception signals of the antennas 1-1 to 1-3 (t3). For a time "t4" subsequent to the time "t3", the demodulating unit 4 performs a demodulating process operation based upon the signals received via the antennas 1-1 to 1-3.

It should also be understood that the above-explained example has described such a case where the measuring operation of the averaged amplitude value and the gain control operation are carried out by 1 time respectively. Alternatively, while the measuring operation of the averaged amplitude value of the packet waiting antenna 1-1 and the gain control operation thereof are carried out plural times, the gain control operations by all of the VGAs 216-1 and 216-2 may be finally carried out.

Figure 2:
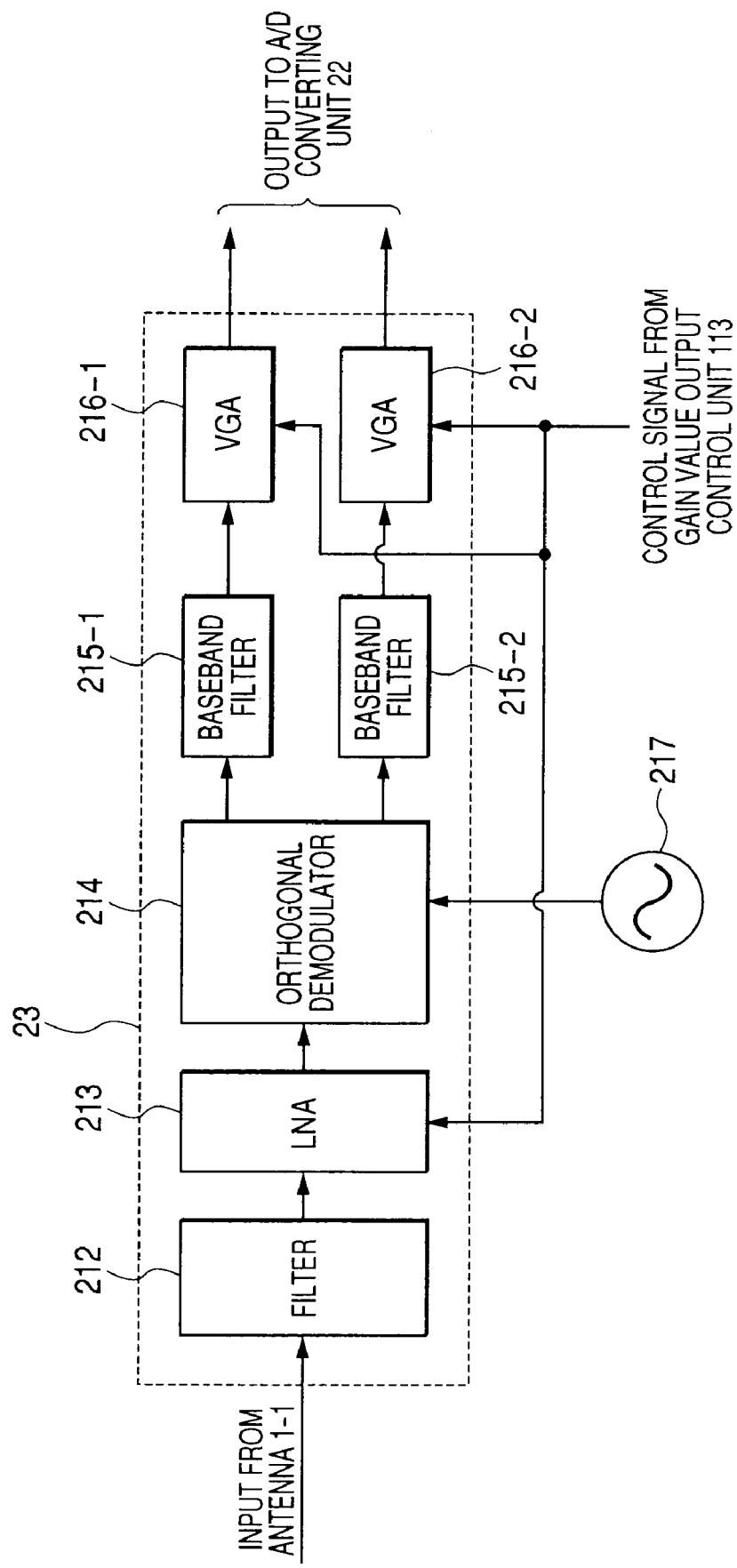
FIG. 2 is an exemplary block diagram for indicating an arrangement of a wireless receiving unit 21 included in an antenna branch 2-1 according to a second embodiment of the present invention.
Figure 3:
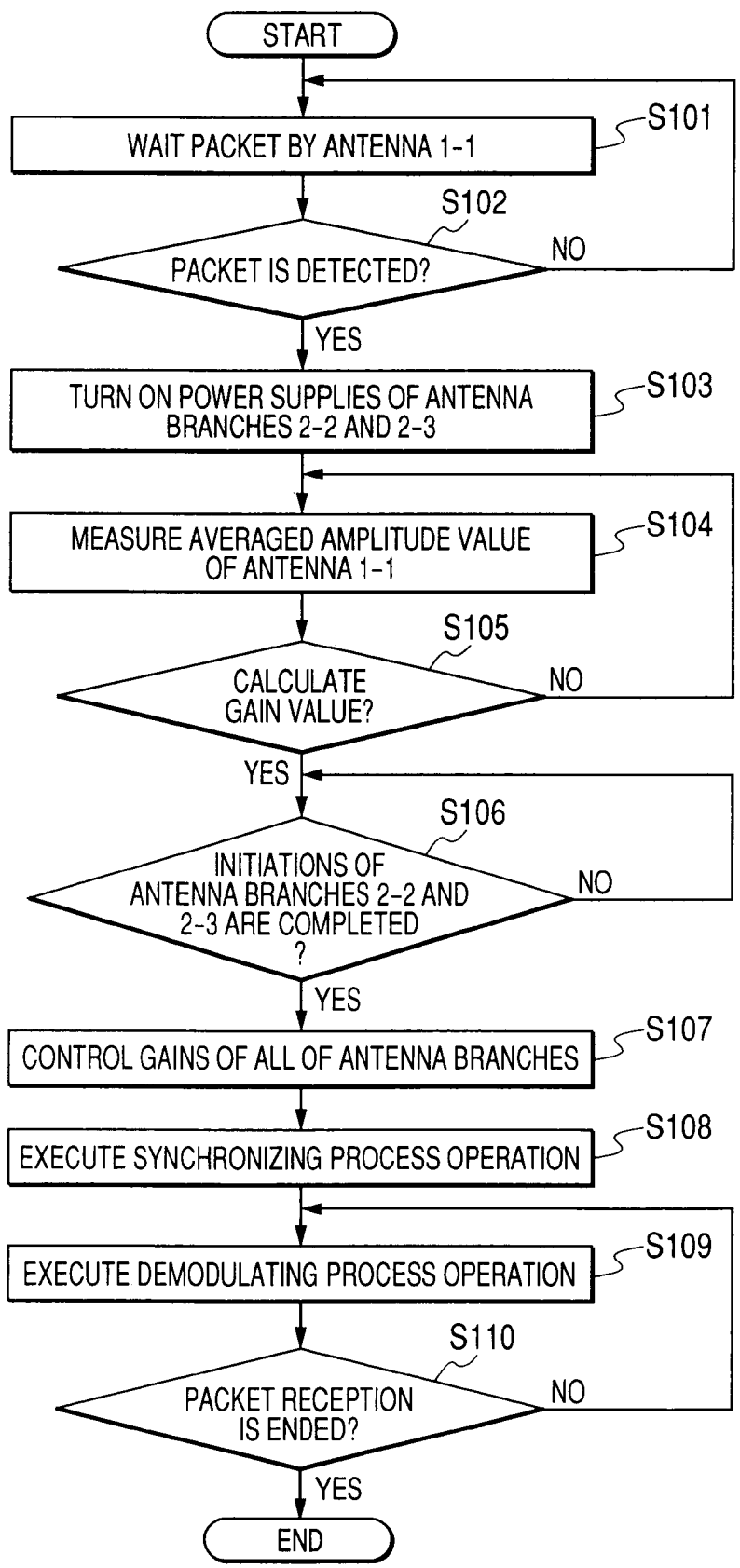
FIG. 3 is an exemplary flow chart for describing operations of the wireless receiving apparatus according to the first embodiment.

Next, a detailed description is made of operations executed when the wireless receiving apparatus is operated in the packet waiting mode and the packet receiving mode respectively with reference to FIG. 1 and FIG. 2.

Firstly, in the case that the wireless receiving apparatus is operated in the packet waiting mode, a signal received via the antenna 1-1 is entered to the wireless receiving unit 21 of the antenna branch 2-1. The reception signal entered to the wireless receiving unit 21 passes through the filter 212 shown in FIG. 2 so as to suppress an interference component thereof outside the band thereof, and thereafter, the filtered signal is inputted to the LNA 213 so as to be amplified. The reception signal amplified by the LNA 213 is inputted to the orthogonal demodulator 214 so as to be converted into an I-phase baseband signal and a Q-phase baseband signal by employing the local oscillator 217.

After the orthogonal conversion, the baseband signal of the I phase passes through the baseband filter 215-1, so that the non-band component of this I-phase baseband signal is suppressed, and thereafter, the electric power of the suppressed baseband signal is amplified by the VGA 216-1, and then, the amplified I-phase baseband signal is outputted to the A/D converting unit 22. Similarly, the baseband signal of the Q phase passes through the baseband filter 215-2, so that the non-band component of this Q-phase baseband signal is suppressed, and thereafter, the electric power of the suppressed baseband signal is amplified by the VGA 216-2, and then, the amplified Q-phase baseband signal is outputted to the A/D converting unit 22.

Next, the I-phase baseband signal entered to the A/D converting unit 22 shown in FIG. 1 is converted from the analog signal to a digital signal, and then, the digital signal is outputted to the amplitude measuring unit 5-1. The amplitude measuring unit 5-1 measures an averaged amplitude value based upon the baseband signal inputted from the A/D converting unit 22. The measure averaged amplitude value is entered to both the reception power calculating unit 6-1 and the selecting unit 112 of the gain value producing unit 11.

The reception power calculating unit 6-1 calculates reception power by employing the averaged amplitude value outputted from the amplitude measuring unit 5-1 and the gain control value outputted from the gain value producing unit 11, and then, outputs the calculation result of the reception power to the antenna selecting unit 7. The antenna selecting unit 7 outputs the entered reception power of the antenna 1-1 to the packet detecting unit 8. Also, the antenna selecting unit 7 notifies information of the packet waiting antenna (in this case, packet waiting antenna corresponds to antenna 1-1) to the selecting unit 111 of the gain value producing unit 11 and the power supply control unit 9.

On the other hand, upon receipt of the notification of the antenna selecting unit 7, the selecting unit 111 of the gain value producing unit 11 outputs the averaged amplitude value of the signal received to the gain value calculating unit 112. The gain value calculating unit 112 calculates a gain control value based upon the entered averaged amplitude value, and then, outputs the calculated gain control value to the gain value output control unit 113. The gain value output control unit 113 outputs the gain control values to the respective antenna branches 2-1 to 2-3 based upon the start timing signal outputted from the timing signal producing unit 10.

The above-described operations are repeatedly carried out until the packet detecting unit 8 detects a packet from the reception power of the antenna 1-1 and the antenna branches 2-2 and 2-3 are initiated. In the case that the packet detecting unit 8 detects the packet, the operation mode of the wireless receiving apparatus is moved from the packet waiting mode to the packet receiving mode.

At this time, in the case that either erroneous detections of packets are increased or the reception power of the antenna 1-1 is considerably lowered during the packet waiting mode, the packet waiting antenna may be alternatively switched from the antenna 1-1 to another antenna 1-2, or 1-3. In this alternative case, for example, the power supplies of all of the antenna branches 2-1 to 2-3 may be alternatively turned ON so as to measure reception power as to all of these antennas 1-1 to 1-3, so that such an antenna may be alternatively selected whose reception power becomes maximum. Further, another antenna may be alternatively selected by which a distortion and a noise characteristic of the wireless receiving unit 21 may become minimum.

When the packet detecting unit 8 detects a packet, the operation mode of the wireless receiving apparatus is moved from the packet waiting mode to the packet receiving mode.

Next, a description is made of operations of the wireless receiving apparatus during this packet receiving mode.

If the packet detecting unit 8 detects a packet, then the packet detecting unit 8 notifies that the packet is detected to the timing signal producing unit 10. The timing signal producing unit 10 which has received this notification outputs a start timing signal to the power supply control unit 9 and the gain value output control unit 113.

The power supply control unit 9 which has received the start timing signal outputs such a signal which turns ON the power supplies of the antenna branches 2-2 and 2-3. When the start timing signal is inputted to the gain value output control unit 113, the gain value output control unit 113 outputs a gain control signal until the gain value output control unit 113 waits for a completion of the initiations of all of the antenna branches 2-1 to 2-3. The gain control signal controls the gain values of all of the VGAs 216-1 to 216-2 to become gain control values.

As previously described, in the first embodiment, the power supplies of the antenna branches 2-2 and 2-3 corresponding to the packet non-waiting antennas 1-2 and 1-3 are turned OFF during the packet waiting mode, and the gain control value is calculated based upon the signal received by the packet waiting antenna 1-1, while the antenna branches 2-2 and 2-3 are being initiated after the packet has been detected. After the antenna branches 2-2 and 2-3 have been initiated, the gain control operations of the VGAs 216-1 and 216-2 included in all of the wireless receiving units 21 are carried out by employing the gain control value which is calculated based upon the signal received by the antenna 1-1. As a consequence, the gain control operations of the VGAs 216-1 and 216-2 included in the wireless receiving units 21 corresponding to all of the antennas 1-1 to 1-3 can be carried out within a very short time (t1+t2).

Also, the power supplies of the antenna branches 2-2 and 2-3 corresponding to the packet non-waiting antennas 1-2 and 1-3 during the packet waiting mode are turned OFF. As a result, the power consumption during the packet waiting time can be reduced.

(Modification 1)

In the First Embodiment, the Gain Control Operations of 3 pieces of the antenna branches 2-1 through 2-3 are carried out for the time "t2", and then, the synchronizing process operation is carried out based upon the signals received by the respective antennas 1-1 to 1-3 for the time "t3" subsequent to the time "t2." This synchronizing process operation may be alternatively performed by employing signals received by a single antenna.

Figure 5:
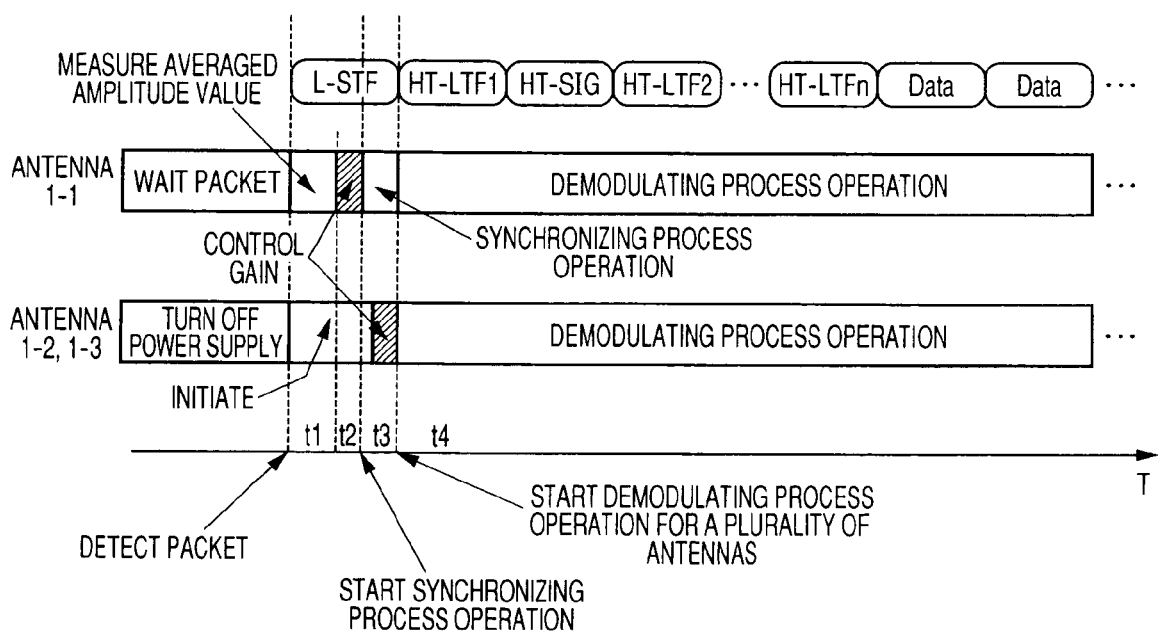
FIG. 5 is an exemplary diagram for indicating operation timing of a wireless receiving apparatus according to a modification 1 of the first embodiment.

To this end, as shown in FIG. 5, in the modification 1, while a gain control operation of the antenna branch 2-1 corresponding to the packet waiting antenna 1-1 may be alternatively carried out for the time "t2", gain control operations of the antenna branches 2-2 and 2-3 corresponding to the packet non-waiting antennas 1-2 and 1-3 may be alternatively carried out within the time "t3" during which the synchronizing unit 3 performs the synchronizing process operation.

As a consequence, the initiation times of the antenna branches 2-2 and 2-3 corresponding to the packet non-waiting antennas 1-2 and 1-3 may be kept long. As a result, even in a wireless receiving apparatus which requires a long initiation time of antenna branches, a power supply of a portion of these antenna branches may be turned OFF during a packet waiting mode, both initiations and gain control operations of the antenna branches may be carried out after a packet is received, so that power consumption during the packet waiting mode can be reduced.

Embodiment 2

Figure 6:
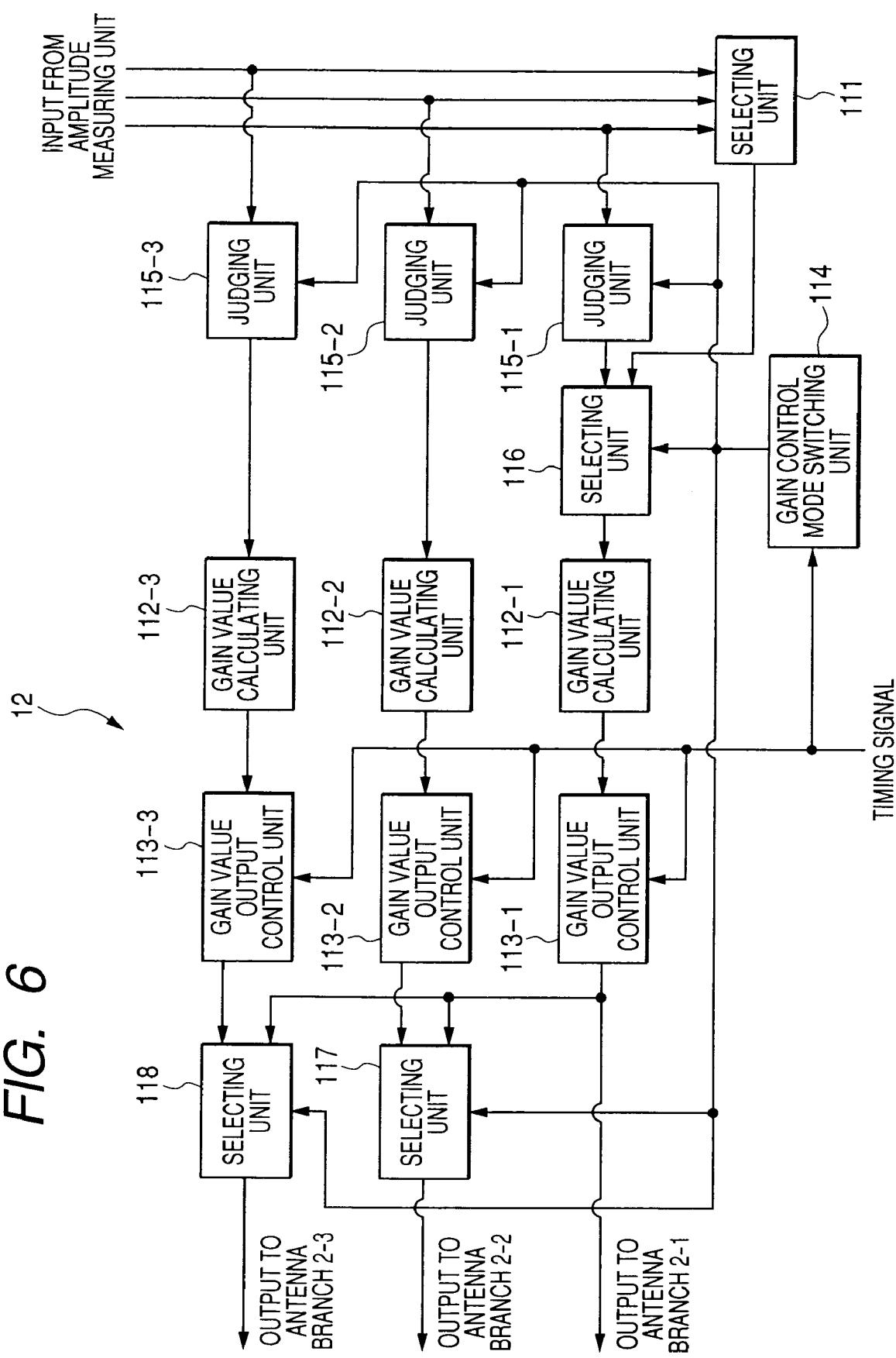
FIG. 6 is an exemplary block diagram for showing a gain value producing unit 12 of the wireless receiving apparatus according to the second embodiment.
Figure 7:
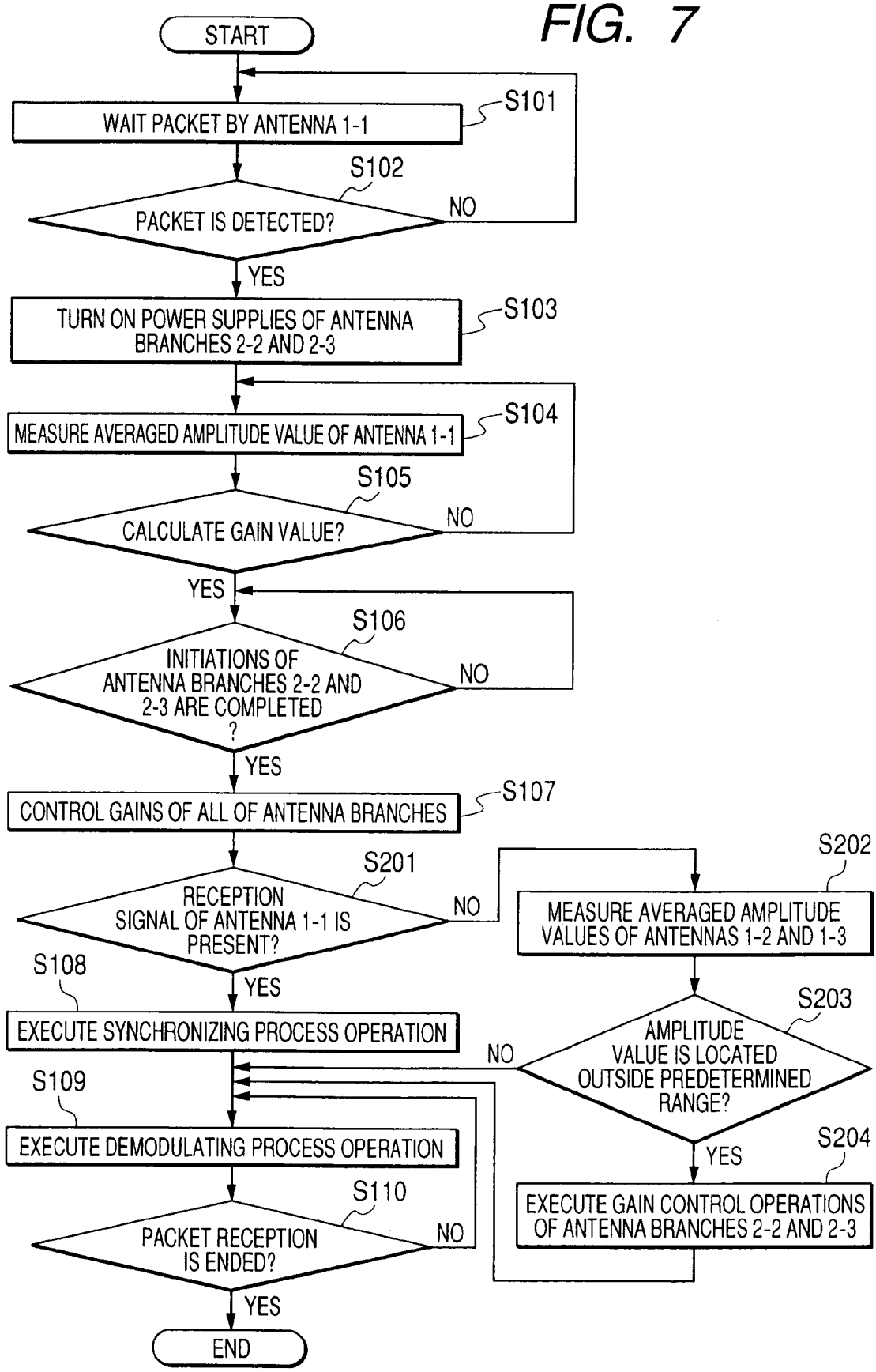
FIG. 7 is an exemplary flow chart for describing operations of the wireless receiving apparatus according to the second embodiment.
Figure 8:
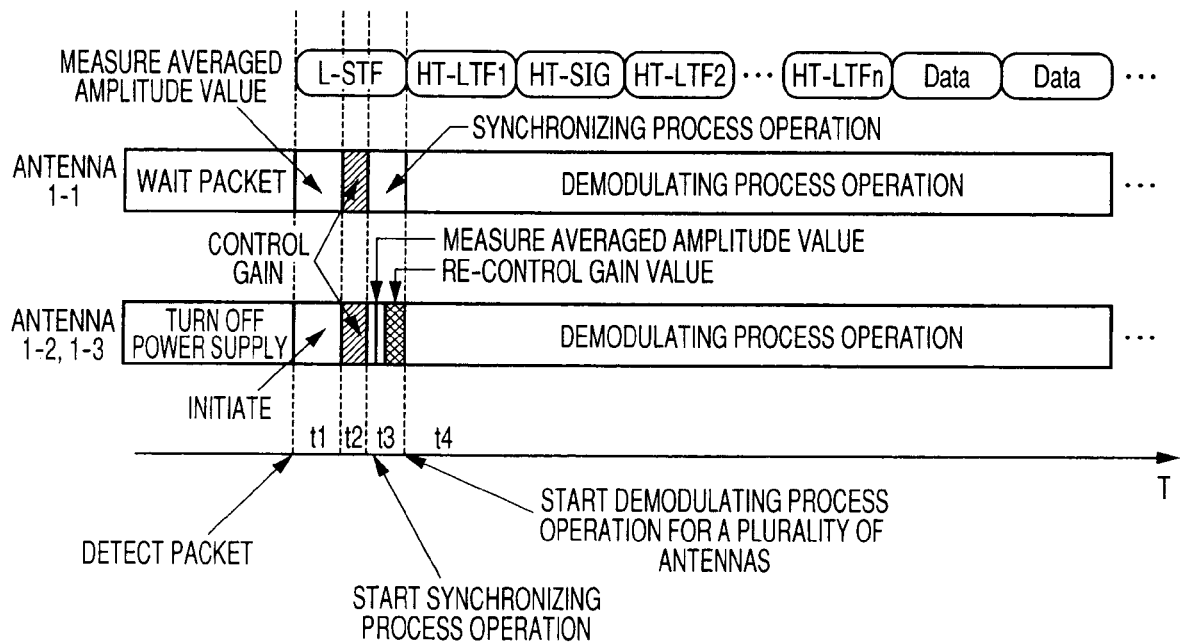
FIG. 8 is an exemplary diagram for representing operation timing of the wireless receiving apparatus when a packet is received, according to the second embodiment.

Next, a description is made of a wireless receiving apparatus according to a second embodiment of the present invention with reference to FIG. 6 to FIG. 8. Since an arrangement and operations of the wireless receiving apparatus according to the second embodiment are substantially identical to the arrangement and the operations of the wireless receiving apparatus shown in FIG. 1 except for the below-mentioned point, the same reference numerals will be employed as those for denoting the structural elements, and therefore, explanations thereof are omitted. As the above-described exceptional point, after a gain control operation (will be referred to as "gain control mode") is carried out based upon a signal received via a packet waiting antenna, a gain re-control operation (will be referred to as "gain re-control mode") of the corresponding antenna branch is carried out based upon a signal received via a packet non-waiting antenna.

FIG. 6 is a block diagram for representing a gain value producing unit 12 of the wireless receiving apparatus according to this second embodiment. The gain value producing unit 12 shown in FIG. 6 has included selecting units 111 and 116 to 118; gain value calculating units 112-1 to 112-3; gain value output control units 113-1 to 113-3; a gain control switching unit 114; and also, judging units 115-1 to 115-3. Among these structural elements, the gain value calculating units 112-1 to 112-3, and the gain value output control units 113-1 to 113-3 are the same as the gain value calculating unit 112 and the gain value output control unit 113 shown in FIG. 1, so that explanations thereof are omitted.

The gain control mode switching unit 114 selects either the gain control mode or the gain re-control mode, and then, outputs the selection result to the judging units 115-1 to 115-3, and the selecting units 116 to 118. The switching operation of the gain control modes is performed based upon a start timing signal and an end timing signal, which are entered from the timing signal producing unit 10. For example, until the start timing signal is entered from the timing signal producing unit 10, the gain control mode switching unit 114 selects the gain control mode; and when the start timing signal is inputted and gain control operations of the respective antenna branches 2-1 to 2-3 are once carried out, the gain control mode switching unit 114 selects the gain re-control mode. Also, when the end timing signal is inputted during the gain re-control mode, the gain control mode switching unit 114 switches the gain re-control mode to the gain control mode.

To the judging units 115-1 to 115-3, averaged amplitude values measured by the corresponding amplitude measuring units 5-1 to 5-3 are entered, and further, such a notification of either the gain control mode or the gain re-control mode is issued from the gain control mode switching unit 114. Each of the judging units 115-1 to 115-3 outputs the inputted averaged amplitude value to the gain value calculating units 112-2 and 112-3, and the selecting unit 116, which are provided at a post stage thereof, during the gain control mode in accordance with the notification issued from the gain control mode switching unit 114.

Also, while the judging units 115-1 to 115-3 have previously stored thereinto the entered averaged amplitude values respectively, these judging units 115-1 to 115-3 judge whether or not the inputted averaged amplitude values are entered within preset amplitude ranges during the gain re-control mode. Then, when an inputted averaged amplitude is located outside the preset amplitude range, the judging units 115-1 to 115-3 update the stored averaged amplitude value by this inputted averaged amplitude value. In the gain re-control mode, the judging units 115-1 to 115-3 output the stored averaged amplitude values to the gain value calculating units 112-2 and 112-3, and the selecting unit 116.

The averaged amplitude value from the judging unit 115-1, and an averaged amplitude value of a signal received by a packet waiting antenna from the selecting unit 111 are inputted to the selecting unit 116. Also, such a notification of either the gain control mode or the gain re-control mode is issued from the gain control mode switching unit 114 to the selecting unit 116. The selecting unit 116 outputs the average amplitude value entered from the selecting unit 111 to the gain value calculating unit 112-1 in the gain control mode, and outputs the averaged amplitude value entered from the judging unit 115-1 in the gain re-control mode.

To the selecting unit 117, gain control signals from the gain value output control unit 113-1 and the gain value output control unit 113-2 are entered, and further, such a notification of either the gain control mode or the gain re-control mode is entered from the gain control mode switching unit 114. As a consequence, in accordance with the notification issued from the gain control mode switching unit 114, the selecting unit 117 outputs the gain control signal entered from the gain value output control unit 113-1 to the antenna branch 2-2 in the gain control mode, and outputs the gain control signal entered from the gain value output control unit 113-2 to the antenna branch 2-2 in the gain re-control mode.

Similarly, to the selecting unit 118, gain control signals from the gain value output control unit 113-1 and the gain value output control unit 113-2 are entered, and further, such a notification signal of either the gain control mode or the gain re-control mode is entered from the gain control mode switching unit 114. As a consequence, the selecting unit 118 outputs the gain control signal entered from the gain value output control unit 113-1 to the antenna branch 2-3 in the gain control mode, and outputs the gain control signal entered from the gain value output control unit 113-3 to the antenna branch 2-3 in the gain re-control mode.

Subsequently, a description is made of operations of the wireless receiving apparatus according to the second embodiment with reference to FIG. 7. It should be understood that in this example, the following description is made of such a case that the antenna 1-1 corresponds to the "packet waiting antenna." A similar description may be alternatively applied to such a case that the antennas 1-2 and 1-3 correspond to the "packet waiting antenna." It should also be understood that since a flow chart up to a step S107 in which gain control operations for all of the antenna branches 2-1 to 2-3 are carried out is identical to the flow chart shown in FIG. 4, the same reference numerals are applied thereto, and therefore, explanations thereof are omitted.

After the gain control operations for all of the antenna branches 2-1 to 2-3 have been performed, in such a case that that a signal corresponds to a reception signal of the antenna 1-1 ("YES" in step S201), the synchronizing unit 3 performs a synchronizing process operation with respect to this signal (step S108).

On the other hand, when signals correspond to reception signals of the antennas 1-2 and 1-3 ("NO" in step S201), the amplitude measuring units 5-2 and 5-3 measure an averaged amplitude value of each of these reception signals (step S202). Next, the judging units 115-1 and 115-3 of the gain value producing unit 12 judge whether or not each of the measured averaged amplitude values is entered within a preset amplitude value (step S203).

In such a case that the averaged amplitude value is entered within the amplitude range ("NO" in step S203) a demodulating process operation is performed by the demodulating unit 4 after waiting that the synchronizing process operation by the synchronizing unit 3 is accomplished (step S109). On the other hand, when the averaged amplitude value is located outside the amplitude range ("YES" in step S203), a gain re-control operation of an antenna branch corresponding to the averaged amplitude value located outside the amplitude range is carried out (step S204), and then, a demodulating process operation is carried out by the demodulating unit 4 (step S209).

While the demodulating process operation of the step S109 is carried out until a reception of a packet is accomplished ("NO" in step S110), if the reception of the packet is ended ("YES" in step S110), then the antenna selecting unit 7 selects the packet waiting antenna, and the wireless receiving apparatus is brought into a packet waiting mode until a next packet is detected.

Subsequently, a description is made of operation timing of the wireless receiving apparatus when a packet is received with reference to FIG. 8. A structure of a packet indicated in an upper stage of FIG. 8 is identical to the structure of the packet shown in the upper stage of FIG. 4, and therefore, a description thereof is omitted. A middle stage of FIG. 8 represents operation timing of the respective units corresponding to the antenna 1-1 constituting the packet waiting antenna, such as the antenna branch 2-1 and the like. A lower stage of FIG. 8 shows operation timing of the respective units corresponding to the packet non-waiting antennas 1-2 and 1-3.

If the packet detecting unit 8 detects the packet and thus the operation mode is switched from the packet waiting mode to the packet receiving mode, then the amplitude measuring unit 5-1 calculates an averaged amplitude value of the signal received by the packet waiting antenna 1-1 and the gain value producing unit 12 calculates a gain control value based upon the averaged amplitude value for the time "t1" of the L-STF section at the head of the packet. On the other hand, the antenna branches 2-2 and 2-3 are initiated for the time "t1" upon receipt of the control signal supplied from the power supply control unit 9.

When the antenna branches 2-2 and 2-3 have been initiated, the gain value producing unit 12 performs gain control operations of the VGAs 216-1 and 216-2 included in the respective wireless receiving units 21 by employing the calculated gain control values (t2). For the time "t3" subsequent to the time "t2", the synchronizing unit 3 performs a synchronizing process operation based upon signals received via antenna 1-1. On the other hand, for the same time "t3", the amplitude measuring units 5-2 and 5-3 measure averaged amplitude values of signals received via the antennas 1-2 and 1-3, and the gain value producing unit 12 produces gain control values for the antenna branches 2-2 and 2-3. After the gain value producing unit 22 has performed the gain control operations of the antenna branches 2-2 and 2-3 based upon the produced gain control values, the demodulating unit 4 performs a demodulating process operation for the remaining packets (t4).

Next, a detailed description is made of operations executed when the wireless receiving apparatus is operated in the packet waiting mode and the packet receiving mode respectively with reference to FIG. 6. In this example, since operations of the wireless receiving apparatus are identical to the above-described operations of the wireless receiving apparatus shown in FIG. 1 except for operations executed by the gain value producing unit 12, explanations thereof are omitted.

A first description is made of operations of the gain value producing unit 12 until the packet detecting unit 8 detects a packet, and the gain value producing unit 12 performs gain control operations for the antenna branches 2-1 to 2-3 for a time "t2" shown in FIG. 8. At this time, the gain control mode switching unit 114 has selected the gain control mode.

In this case, values measured by the respective amplitude measuring units 5-1 to 5-3 are inputted to the selecting unit 111 of the gain value producing unit 12 and the corresponding judging units 115-1 to 115-3. The selecting unit 111 selects an averaged amplitude value (namely, value inputted from amplitude measuring unit 5-1 in this case) of a signal received by the packet waiting antenna 1-1 from the values inputted from the amplitude measuring units 5-1 to 5-3 in accordance with notification issued from the antenna selecting unit 7 so as to output the selected averaged amplitude value to the selecting unit 116.

On the other hand, a value inputted to the judging unit 115-1 is directly outputted to the selecting unit 116, whereas values inputted to the judging units 115-2 and 115-3 are directly outputted to the gain value calculating units 112-2 and 112-3 respectively.

To the selecting unit 116, the averaged amplitude value of the signal received by the packet waiting antenna is entered from the selecting unit 111, and also, the value measured by the amplitude measuring unit 5-1 is entered from the judging unit 115-1. In this example, since the antenna 1-1 has been selected as the packet waiting antenna, the same values are entered from the selecting unit 111 and the judging unit 115-1.

Also, such a message that the operation mode is the gain control mode is notified to the selecting unit 116. The selecting unit 116 outputs the averaged amplitude value of the packet waiting antenna 1-1 entered from the selecting unit 111 to the gain value calculating unit 112-1.

The gain value calculating units 112-1 to 112-3 into which the values have been entered from either the selecting unit 116 or the judging units 115-2 and 115-3 calculate gain control values of the antenna branches 2-1 to 2-3 based upon the input value, and then, output the calculated gain control values to the gain value output control units 113-1 to 113-3.

The gain value output control unit 113-1 outputs a gain control value entered from the gain value calculating unit 113-1 to the antenna branch 2-1 and the selecting units 117 and 118 based upon the start timing signal entered from the timing signal producing unit 10. Similarly, the gain value output control units 113-2 and 113-3 output the gain control values to the selecting units 117 and 118 based upon the start timing signal, respectively.

To the selecting unit 117, the gain control value are entered from the gain value output control units 113-1 and 113-2. The selecting unit 117 outputs a gain control value (namely, gain control value calculated based upon reception signal of packet waiting antenna 1-1) entered from the gain value output control unit 113-1 to the antenna branch 2-2 in accordance with the notification issued from the gain control mode switching unit 114.

To the selecting unit 118, the gain control values are entered from the gain value output control units 113-1 and 113-3. The selecting unit 118 outputs a gain control value (namely, gain control value calculated based upon reception signal of packet waiting antenna 1-1) entered from the gain value output control unit 113-3 to the antenna branch 2-3 in accordance with the notification issued from the gain control mode switching unit 114.

Next, a description is made of operations of the gain value producing unit 12 in such a case that the gain value producing unit 12 performs gain control operations of the antenna branches 2-2 and 2-3 for a time "t3" indicated in FIG. 8. At this time, the gain control mode switching unit 114 has selected the gain re-control mode.

In this case, the averaged amplitude values measured by the respective amplitude measuring units 5-1 to 5-3 are inputted to the selecting unit 111 of the gain value producing unit 12 and the corresponding judging units 115-1 to 115-3. The selecting unit 111 selects an averaged amplitude value (namely, value inputted from amplitude measuring unit 5-1 in this case) of a signal received by the packet waiting antenna 1-1 from the entered averaged amplitude values so as to output the selected averaged amplitude value to the selecting unit 116.

On the other hand, the judging unit 115-1 judges whether or not the averaged amplitude value outputted from the amplitude measuring unit 5-1 is converged within a predetermined amplitude range. If the averaged amplitude value is not converged within the predetermined amplitude range, then the judging unit 115-1 updates the stored averaged amplitude value by the inputted averaged amplitude value. Furthermore, the judging unit 115-1 outputs the stored averaged amplitude value to the selecting unit 116. Similarly, the judging units 115-2 and 115-3 perform judging operations for the amplitude measurement values entered from the amplitude measuring units 5-2 and 5-3 respectively, and then, output the stored averaged amplitude values to the gain value calculating units 112-2 and 112-3 respectively.

To the selecting unit 116, the averaged amplitude value of the signal received by the packet waiting antenna is entered from the selecting unit 111, and also, the value measured by the amplitude measuring unit 5-1 is entered from the judging unit 115-1. Also, such a message that the operation mode is the gain re-control mode is notified to the selecting unit 116. The selecting unit 116 outputs the averaged amplitude value of the packet waiting antenna 1-1 entered from the judging unit 115-1 to the gain value calculating unit 112-1 in the case of the gain re-control mode.

The gain value calculating units 112-1 to 112-3 calculate gain control values of the antenna branches 2-1 to 2-3 based upon the inputted averaged amplitude value, and then, output the calculated gain values to the gain value output control units 113-1 to 113-3.

The gain value output control unit 113-1 outputs the gain control value entered from the gain value calculating unit 113-1 to the antenna branch 2-1 and the selecting units 117 and 118 based upon the start timing signal entered from the timing signal producing unit 10. Similarly, the gain value output control units 113-2 and 113-3 output the gain control values to the selecting units 117 and 118 based upon the start timing signal, respectively.

To the selecting unit 117, the gain control values are entered from the gain value output control units 113-1 and 113-2. Since the selecting unit 117 receives such a notification that the operation mode is the gain re-control mode from the gain control mode switching unit 114, the selecting unit 117 outputs the gain control value (namely, gain control value calculated based upon reception signal of antenna 1-2) entered from the gain value output control unit 113-2 to the antenna branch 2-2.

To the selecting unit 118, the gain control values are entered from the gain value output control units 113-1 and 113-3. Since the selecting unit 118 similarly receives such a notification that the operation mode is the gain re-control mode from the gain control mode switching unit 114, the selecting unit 118 outputs the gain control value (namely, gain control value calculated based upon reception signal of antenna 1-3) entered from the gain value output control unit 113-3 to the antenna branch 2-3.

As previously described, in the second embodiment, a similar advantage to that of the first embodiment can be achieved. In addition, while the synchronizing process operation is carried out based upon the reception signal of the packet receiving antenna 1-1, since the gains of the antenna branches 2-2 and 2-3 are re-controlled based upon the reception signals of the packet non-waiting antennas 1-2 and 1-3, even in such a case that the averaged amplitude values of the reception signals from the antennas 1-1 to 1-3 are different from each other, the gain control operations can be performed in correspondence with the respective antennas 1-1 to 1-3, so that the entire reception performance of the wireless receiving apparatus can be improved.

Embodiment 3

Figure 9:
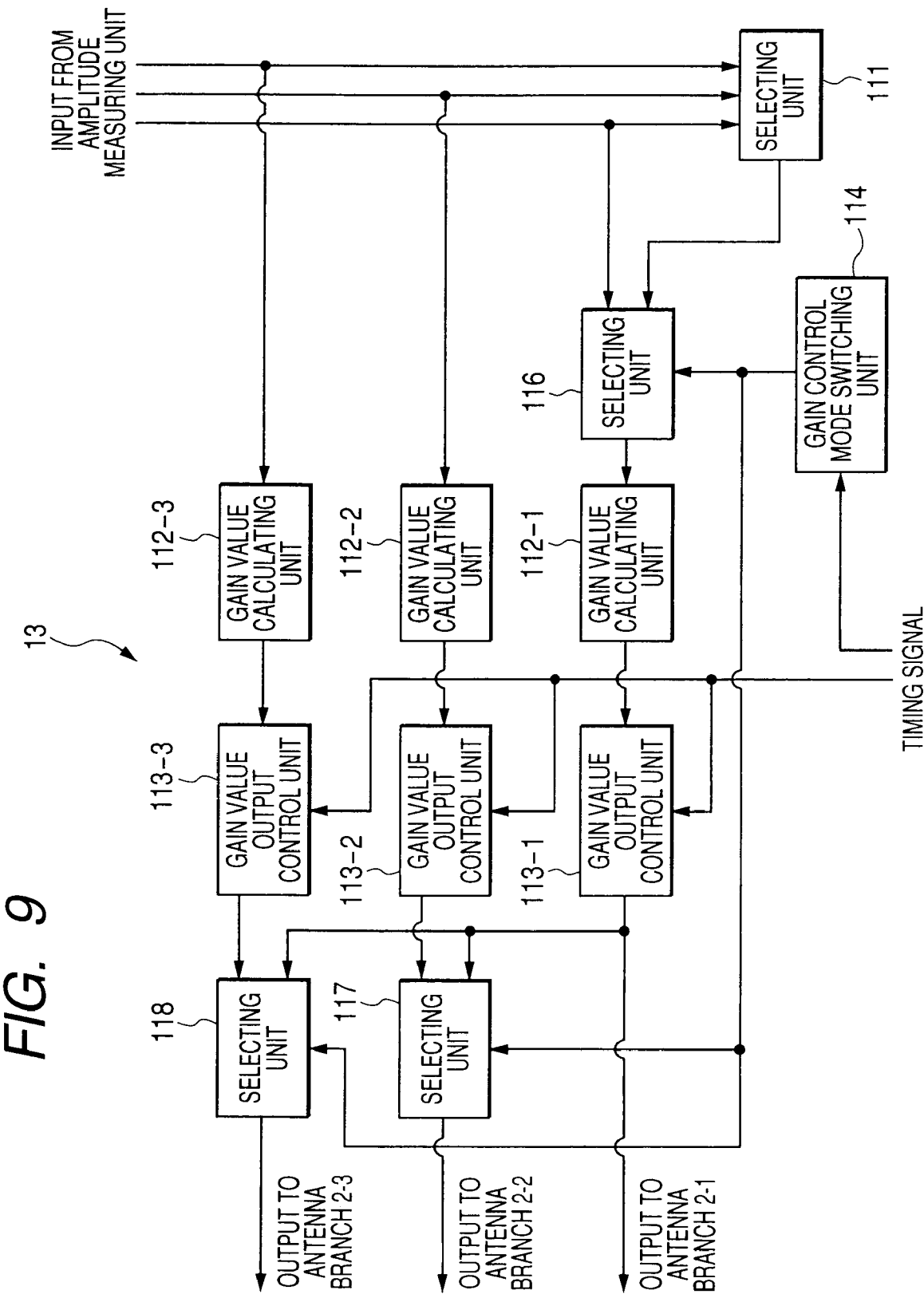
FIG. 9 is an exemplary block diagram for showing a gain value producing unit 13 of a wireless receiving apparatus according to a third embodiment of the present invention.
Figure 10:
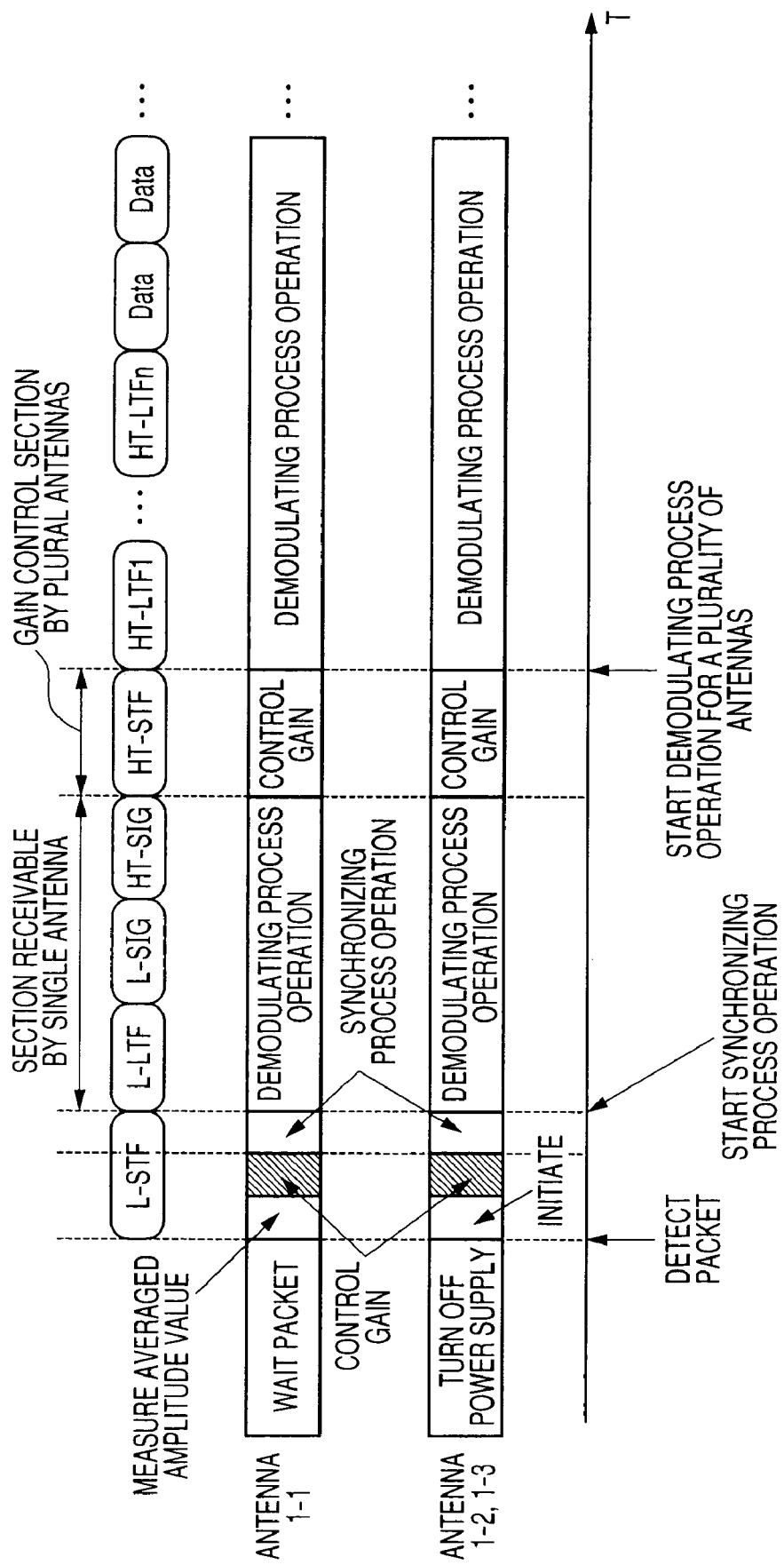
FIG. 10 is an exemplary diagram for representing operation timing of the wireless receiving apparatus when a packet is received, according to the third embodiment.

Next, a description is made of a wireless receiving apparatus according to a third embodiment of the present invention with reference to FIG. 9 and FIG. 10. A structure of a packet received by the wireless receiving apparatus according to the third embodiment is different from the structure of the packet (namely, packet received by wireless receiving apparatus of FIG. 1) indicated in FIG. 4, and contains two sections where gain control operations are performed.

To this end, the wireless receiving apparatus according to this third embodiment controls gains of all of wireless receiving units based upon reception power of a signal received by a packet waiting antenna (will be referred to as "first control mode" hereinafter), and thereafter, again controls the gains of the wireless receiving units based upon reception power of signals received by the respective antennas (will be referred to as "second control mode" hereinafter).

Since an arrangement and operations of the wireless receiving apparatus according to the third embodiment are substantially identical to the arrangement and the operations of the wireless receiving apparatus shown in FIG. 1 except for the below-mentioned point, the same reference numerals will be employed as those for denoting the same structural elements, and therefore, explanations thereof are omitted. As the above-described exceptional point, gain control operations of the antenna branches 2-1 to 2-3 are carried out by being subdivided into two controlling stages.

FIG. 9 is a block diagram for representing a gain value producing unit 13 of the wireless receiving apparatus according to this third embodiment. Although the gain value producing unit 13 has the substantially same arrangement as that of the gain value producing unit 12 indicated in FIG. 6, the gain value producing unit 13 contains such a different point that the above-described judging units 115-1 to 115-3 are not provided.

The gain control mode switching unit 114 selects either the first control mode or the second control mode, and then, outputs the selection result to the selecting units 116 to 118. The switching operation of the gain control modes is performed based upon a start timing signal and an end timing signal, which are entered from the timing signal producing unit 10. For example, until the start timing signal is entered from the timing signal producing unit 10, the gain control mode switching unit 114 selects the first control mode; and when the start timing signal is inputted and gain control operations of the respective antenna branches 2-1 to 2-3 are once carried out, the gain control mode switching unit 114 selects the second control mode. Also, when the end timing signal is inputted during the second control mode, the gain control mode switching unit 114 switches the second control mode to the first control mode.

A value measured by the amplitude measuring unit 5-1, and an averaged amplitude value of a signal received by a packet waiting antenna from the selecting unit 111 are inputted to the selecting unit 116. Also, such a notification of either the first control mode or the second control mode is issued from the gain control mode switching unit 114 to the selecting unit 116. The selecting unit 116 outputs the average amplitude value entered from the selecting unit 111 to the gain value calculating unit 112-1 in the first control mode, and outputs thereto the value entered from the amplitude measuring unit 5-1 in the second control mode.

The gain value calculating units 112-1 to 112-3 calculate gain control values of the antenna branches 2-1 to 2-3 based upon the values entered from the selecting unit 116 and the respective amplitude measuring units 5-2 and 5-3, and then, output the calculated gain control values to the gain value output control units 113-1 to 113-3.

The gain value output control unit 113-1 outputs a gain control value entered from the gain value calculating unit 113-1 to the antenna branch 2-1 and the selecting units 117 and 118 based upon the start timing signal entered from the timing signal producing unit 10. Similarly, the gain value output control units 113-2 and 113-3 output the gain control values to the selecting units 117 and 118 based upon the start timing signal, respectively.

To the selecting unit 117, gain control signals from the gain value output control unit 113-1 and the gain value output control unit 113-2 are entered, and further, such a notification of either the first control mode or the second control mode is entered from the gain control mode switching unit 114. As a consequence, the selecting unit 117 outputs the gain control signal entered from the gain value output control unit 113-1 to the antenna branch 2-2 in the first control mode, and outputs the gain control signal entered from the gain value output control unit 113-2 to the antenna branch 2-2 in the second control mode.

Similarly, to the selecting unit 118, gain control signals from the gain value output control unit 113-1 and the gain value output control unit 113-2 are entered, and further, such a notification signal of either the first control mode or the second control mode is entered from the gain control mode switching unit 114. As a consequence, the selecting unit 118 outputs the gain control signal entered from the gain value output control unit 113-1 to the antenna branch 2-3 in the first control mode, and outputs the gain control signal entered from the gain value output control unit 113-3 to the antenna branch 2-3 in the second control mode.

Subsequently, a description is made of operations of the wireless receiving apparatus according to the third embodiment with reference to FIG. 10. FIG. 10 is a diagram for explaining operation timing of the wireless receiving apparatus according to this third embodiment. An upper stage of FIG. 10 shows the structural example of the packet in conformity to the draft (Version 1.0) of IEEE 802.11n.

The packet shown in the upper stage of FIG. 10 contains an L-STF section positioned at a head thereof, an L-LTF section, an L-SIG section, an HT-SIG section, an HT-STF section, and HT-LTF1 to n sections, and finally, a DATA section corresponding to a data stream. The L-STF section is employed in a gain control operation and a synchronizing process operation. The L-LTF section is employed so as to calculate a transfer path response. The L-SIG and HT-SIG sections correspond to a header information portion. The HT-STF section is employed so as to perform a gain control operation in the second control mode. The HT-LTF1 to n (symbol "n" indicate stream number, and is determined by communication system) sections are employed so as to calculate a transfer path response.

The wireless receiving apparatus according to the third embodiment calculates a transfer path response by employing the L-LTF section, and demodulates the L-SIG and HT-SIG sections by employing the calculated transfer path response so as to recognize such header information as a packet length, a modulation system, and the MIMO system. It should be noted that in this example, the L-LTF, L-SIG, and HT-SIG sections can be demodulated by employing a single antenna.

As a consequence, a transfer method for the sections up to the HT-SIG section, which can be demodulated by the single antenna is different from a transfer method for the sections after the HT-STF section, which are demodulated by the plural antennas. To this end, after the sections up to the HT-SIG section have been demodulated, a gain control operation is again carried out in the HT-STF section, and the sections after the HT-LTF1 section are demodulated.

Subsequently, a description is made of operation timing of the wireless receiving apparatus when a packet is received. A middle stage of FIG. 10 represents operation timing of the respective units corresponding to the antenna 1-1 constituting the packet waiting antenna, such as the antenna branch 2-1 and the like. A lower stage of FIG. 10 shows operation timing of the respective units corresponding to the packet non-waiting antennas 1-2 and 1-3.

Although the below-mentioned explanation is made of such a case that the antenna 1-1 constitutes a packet waiting antenna, this explanation may be similarly applied to another case that the antennas 1-2 and 1-3 constitute the packet waiting antennas. It should also be noted that since timing at which the gain control operations of the antenna branches 2-1 to 2-3 are carried out by employing the L-STF section is identical to the operation timing of the wireless receiving apparatus shown in FIG. 4, a description thereof is omitted.

After the gain control operations of the antenna branches 2-1 to 2-3 are carried out based upon the reception signal of the packet waiting antenna 1-1, the wireless receiving apparatus receives signals via the respective antennas 1-1 to 1-3 within the L-LTF section through the HT-SIG section which can be received by employing the single antenna, and then, performs either a selecting process operation or a synthesizing diversity process operation so as to demodulate the reception signals. Alternatively, after the gain control operation, outputs from the amplitude measuring units 5-1 to 5-3 may be measured respectively, and then, a demodulating process operation and a synchronizing process operation may be carried out by employing only such a reception signal whose amplitude is converged within a predetermined amplitude range.

As previously described, after the demodulating process operation has been performed for the signals of the L-LTF section to the HT-SIG section, a gain control operation is again performed in the subsequent section HT-STF section. This operation corresponds to the gain control operation in the second control mode, and gain control operations for the respective antenna branches 2-1 to 2-3 are carried out based upon the signals received via the respective antennas 1-1 to 1-3. It should also be noted that a gain control value after the HT-LTF1 section is not so largely different from a gain value controlled in the L-STF section. As a consequence, since the gains are controlled with respect to the antenna branches 2-1 to 2-3 in the L-STF section, the gain control performed in the HT-STF section is a fine gain control.

The wireless receiving apparatus which has performed the fine gain control operation in the HT-STF section performs a demodulating process operation with respect to signals received via the respective antennas 1-1 to 1-3 in the HT-LTF1 section and the subsequent sections.

Next, a detailed description is made of operations executed when the wireless receiving apparatus is operated in the packet waiting mode and the packet receiving mode respectively. In this example, since operations of the wireless receiving apparatus are identical to the above-described operations of the wireless receiving apparatus shown in FIG. 1 except for operations executed by the gain value producing unit 13, explanations thereof will be omitted.

A first description is made of operations of the gain value producing unit 13 until the packet detecting unit 8 detects a packet, and the gain value producing unit 13 performs gain control operations for the antenna branches 2-1 to 2-3. At this time, the gain control mode switching unit 114 has selected the first control mode.

In this case, a value measured by the respective amplitude measuring unit 5-1 is inputted to the selecting unit 111 and the selecting unit 116. On the other hand, values measured by the amplitude measuring units 5-2 and 5-3 are inputted to the corresponding judging units 115-2 and 115-3. The selecting unit 111 selects an averaged amplitude value (namely, value inputted from amplitude measuring unit 5-1 in this case) of a signal received by the packet waiting antenna 1-1 in accordance with notification issued from the antenna selecting unit 7 so as to output the selected averaged amplitude value to the selecting unit 116.

To the selecting unit 116, the averaged amplitude value of the signal received by the packet waiting antenna is entered from the selecting unit 111, and also, the value measured by the amplitude measuring unit 5-1 is entered. In this example, since the antenna 1-1 has been selected as the packet waiting antenna, the same values are entered from the selecting unit 111 and the amplitude measuring unit 5-1. Further, either the first control mode or the second control mode from the gain control mode switching unit 114 is notified to the selecting unit 116. Also, such a message that the operation mode is the first control mode is notified to the selecting unit 116. As a consequence, the selecting unit 116 outputs the averaged amplitude value of the packet waiting antenna 1-1 entered from the selecting unit 111 to the gain value calculating unit 112-1.

The gain value calculating units 112-1 to 112-3 into which the values have been entered from either the selecting unit 116 or the amplitude measuring units 5-2 and 5-3 calculate gain control values of the antenna branches 2-1 to 2-3 based upon the input value, and then, output the calculated gain control values to the gain value output control units 113-1 to 113-3.

The gain value output control unit 113-1 outputs a gain control value entered from the gain value calculating unit 113-1 to the antenna branch 2-1 and the selecting units 117 and 118 based upon the start timing signal entered from the timing signal producing unit 10. Similarly, the gain value output control units 113-2 and 113-3 output the gain control values to the selecting units 117 and 118 based upon the start timing signal, respectively.

To the selecting unit 117, the gain control value are entered from the gain value output control units 113-1 and 113-2. The selecting unit 117 outputs a gain control value entered from any one of the gain value output control units 113-1 and 113-2 to the antenna branch 2-2 in accordance with the notification issued from the gain control mode switching unit 114. In this case, since the selecting unit 117 receives such a notification that the operation mode is the first control mode from the gain control mode switching unit 114, the selecting unit 117 outputs a gain control value (namely, gain control value calculated based upon reception signal of packet waiting antenna 1-1) entered from the gain value output control unit 113-1 to the antenna branch 2-2.

To the selecting unit 118, the gain control values are entered from the gain value output control units 113-1 and 113-3. The selecting unit 118 similarly outputs a gain control value (namely, gain control value calculated based upon reception signal of packet waiting antenna 1-1) entered from the gain value output control unit 113-1 to the antenna branch 2-3, since the selecting unit 118 receives such a notification (first control mode) issued from the gain control mode switching unit 114.

Next, a description is made of operations of the gain value producing unit 13 in such a case that the gain value producing unit 13 performs gain fine control operations of the antenna branches 2-1 to 2-3 in the section HT-STF section. At this time, the gain control mode switching unit 114 has selected the second control mode.

In this case, the averaged amplitude values measured by the respective amplitude measuring units 5-1 to 5-3 are inputted to the selecting units 111 and 116, and the gain value calculating units 112-2 and 112-3. The selecting unit 111 selects an averaged amplitude value (namely, value inputted from amplitude measuring unit 5-1 in this case) of a signal received by the packet waiting antenna 1-1 from the entered averaged amplitude values so as to output the selected averaged amplitude value to the selecting unit 116.

To the selecting unit 116, the averaged amplitude value of the signal received by the packet waiting antenna is entered from the selecting unit 111, and also, the value measured by the amplitude measuring unit 5-1 is entered. Also, such a message that the operation mode is the second control mode is notified to the selecting unit 116. The selecting unit 116 outputs the averaged amplitude value of the packet waiting antenna 1-1 entered from the amplitude measuring unit 5-1 to the gain value calculating unit 112-1 in the case of the second control mode.

The gain value calculating units 112-1 to 112-3 calculate gain control values of the antenna branches 2-1 to 2-3 based upon the inputted averaged amplitude value, and then, output the calculated gain values to the gain value output control units 113-1 to 113-3.

The gain value output control unit 113-1 outputs the gain control value entered from the gain value calculating unit 113-1 to the antenna branch 2-1 and the selecting units 117 and 118 based upon the start timing signal entered from the timing signal producing unit 10.

To the selecting unit 117, the gain control values are entered from the gain value output control units 113-1 and 113-2. Since the selecting unit 117 receives such a notification that the operation mode is the second control mode from the gain control mode switching unit 114, the selecting unit 117 outputs the gain control value (namely, gain control value calculated based upon reception signal of antenna 1-2) entered from the gain value output control unit 113-2 to the antenna branch 2-2.

To the selecting unit 118, the gain control values are entered from the gain value output control units 113-1 and 113-3. Since the selecting unit 118 similarly receives such a notification that the operation mode is the second control mode from the gain control mode switching unit 114, the selecting unit 118 outputs the gain control value (namely, gain control value calculated based upon reception signal of antenna 1-3) entered from the gain value output control unit 113-3 to the antenna branch 2-3.

As previously described, in the third embodiment, a similar advantage to that of the first embodiment can be achieved. In addition, since the gain control operations of the antenna branches 2-1 to 2-3 are again carried out in the HT-STF section, the gains can be fine-controlled in conjunction with the packet receptions in the subsequent HT-LTF1 section and the succeeding sections thereof, so that the reception performance of the wireless receiving apparatus can be improved.

(Modification 2)

In the third embodiment, while the averaged amplitude value of the reception signal of the packet waiting antenna 1-1 is being measured, the antenna branches 2-2 and 2-3 corresponding to the packet non-waiting antenna are initiated. Thereafter, the gain control operations of all of the antenna branches 2-1 to 2-3 are carried out, and the synchronizing process operation is carried out based upon the signals received by the respective antennas 1-1 to 1-3. Alternatively, this synchronizing process operation may be carried out by employing the signal received by the signal antenna.

Figure 11:
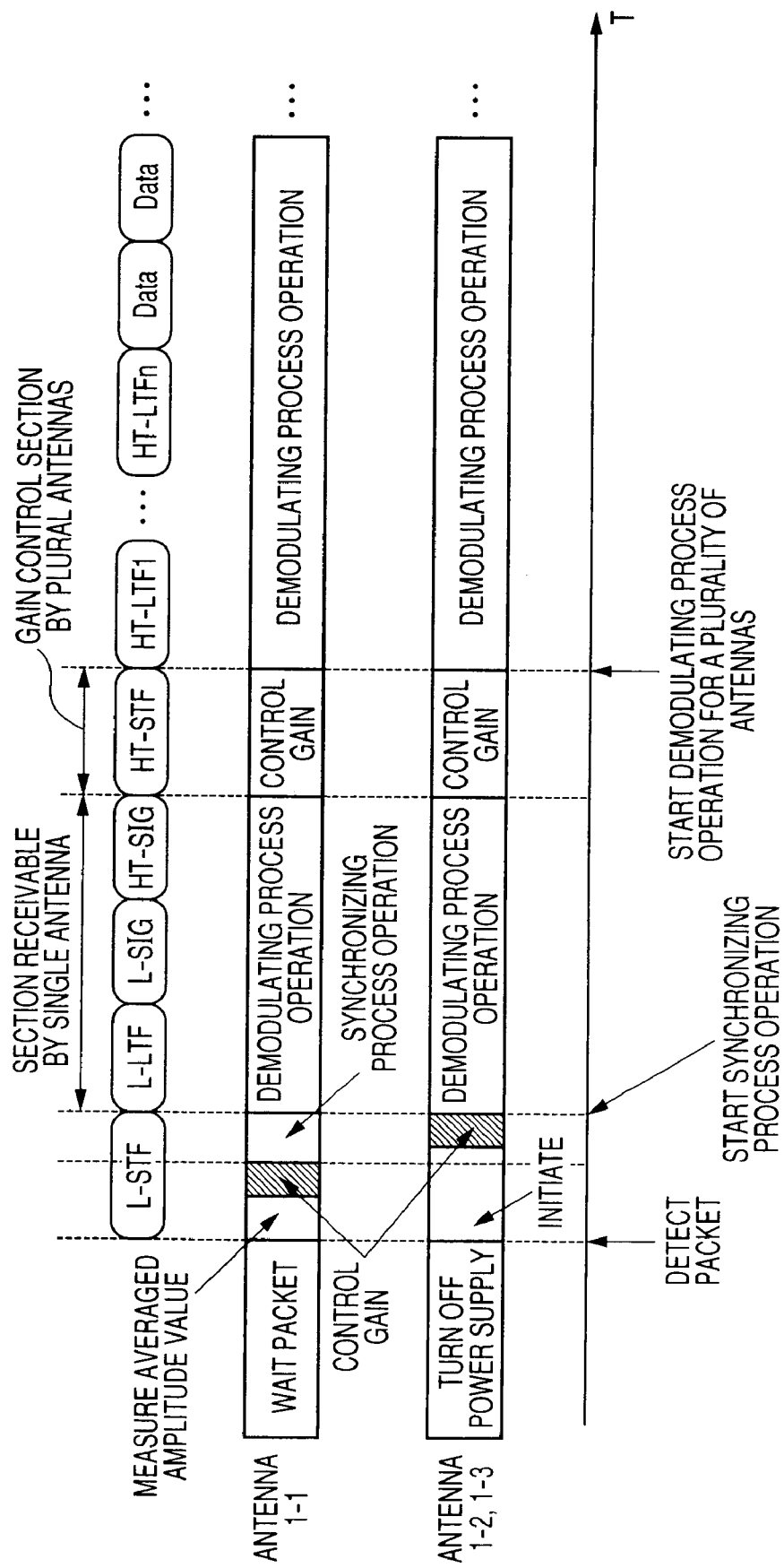
FIG. 11 is an exemplary diagram for indicating operation timing of a wireless receiving apparatus according to a modification 2 of the third embodiment.

FIG. 11 shows operation timing of the wireless receiving apparatus according to this modification 2. In the modification 2, similar to the modification 1, while the synchronizing unit 3 performs a synchronizing process operation, gain control operations of the antenna branches 2-2 and 2-3 are carried out.

As a consequence, the initiation times of the antenna branches 2-2 and 2-3 corresponding to the packet non-waiting antennas 1-2 and 1-3 may be kept long. As a result, even in a wireless receiving apparatus which requires a long initiation time of antenna branches, a power supply of a portion of these antenna branches may be turned OFF during a packet waiting mode, both initiations and gain control operations of the antenna branches may be carried out after a packet is received, so that power consumption during the packet waiting mode can be reduced.

(Modification 3)

Figure 12:
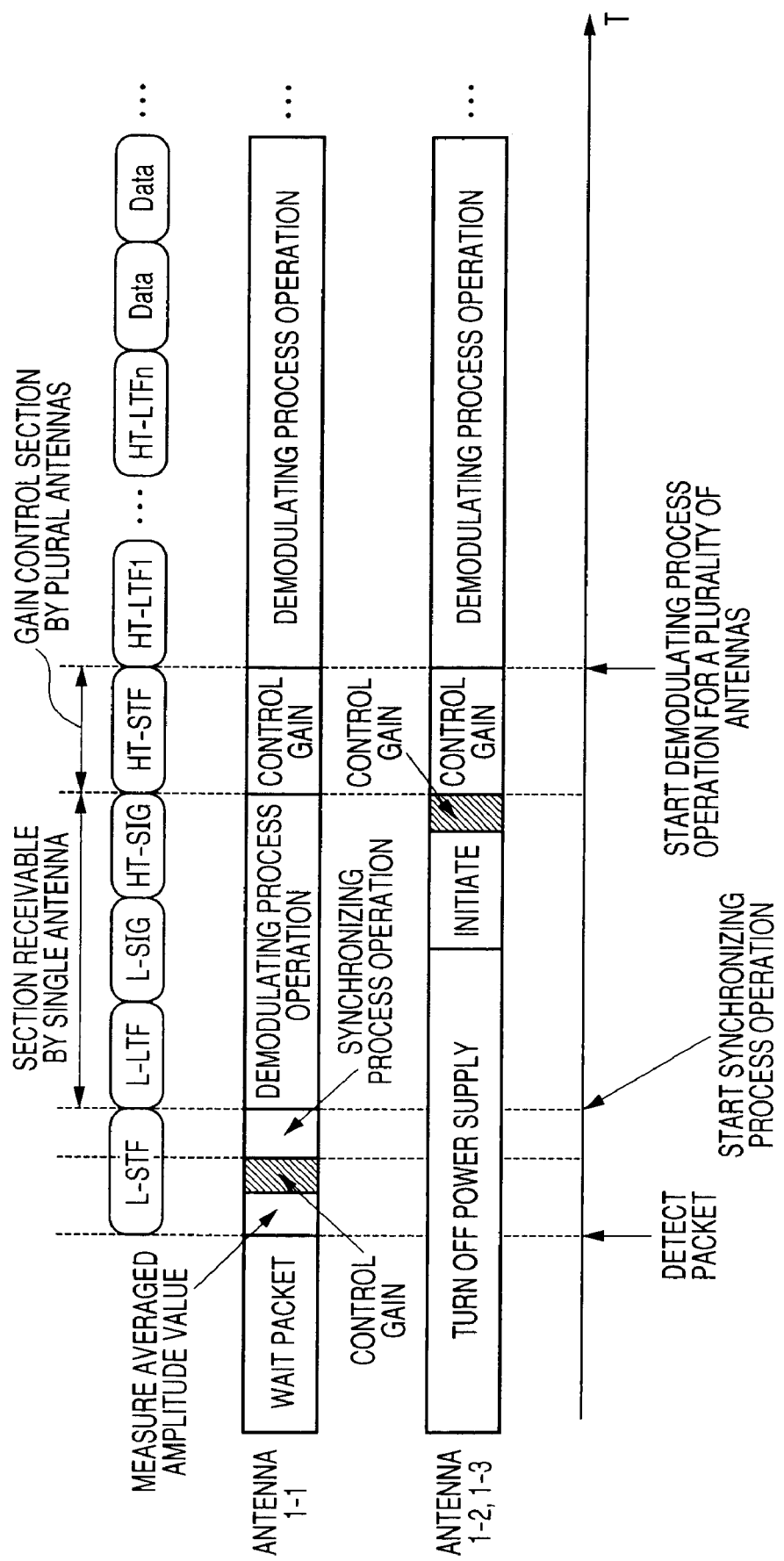
FIG. 12 is an exemplary diagram for indicating operation timing of a wireless receiving apparatus according to a modification 3 of the third embodiment.

Next, FIG. 12 shows an example of operation timing of a wireless receiving apparatus according to a modification 3. In this modification 3, receptions of the L-LTF section to the HT-SIG section which can be received by a single antenna are carried out by the antenna 1-1.

Similar to the middle stage of FIG. 10, the wireless receiving apparatus performs a gain control operation, a synchronizing process operation, and a demodulating process operation based upon a signal received via the packet waiting antenna 1-1. In such a case that signals of the L-LTF section to the HT-SIG section are received by the antenna 1-1, the antenna branches 2-2 and 2-3 may perform an initiation operation and the gain control operation until the HT-STF section.

To this end, the antenna branches 2-2 and 2-3 corresponding to the packet non-waiting antennas 1-2 and 1-3 are initiated while the demodulating process operation is carried out in the L-LTF section to the HT-SIG section, the antenna branch 2-1 performs the gain control operation by utilizing the gain control value obtained in the gain control operation in the first control mode.

As previously described, the antenna branches 2-2 and 2-3 are initiated while the demodulating process operation is carried out based upon the reception signal of the packet waiting antenna 1-1. As a result, the power supplies can be turned OFF even after the reception of the packet is detected, so that power consumption of the wireless receiving apparatus can be reduced.

Also, since the commencement of the initiation operation can be controlled in correspondence with the initiation time of the antenna branch, even in such a wireless receiving apparatus which requires a lengthy time for initiating antenna branches, a power supply of a portion of the antenna branches can be turned OFF in the packet waiting mode.

Embodiment 4

Figure 13:
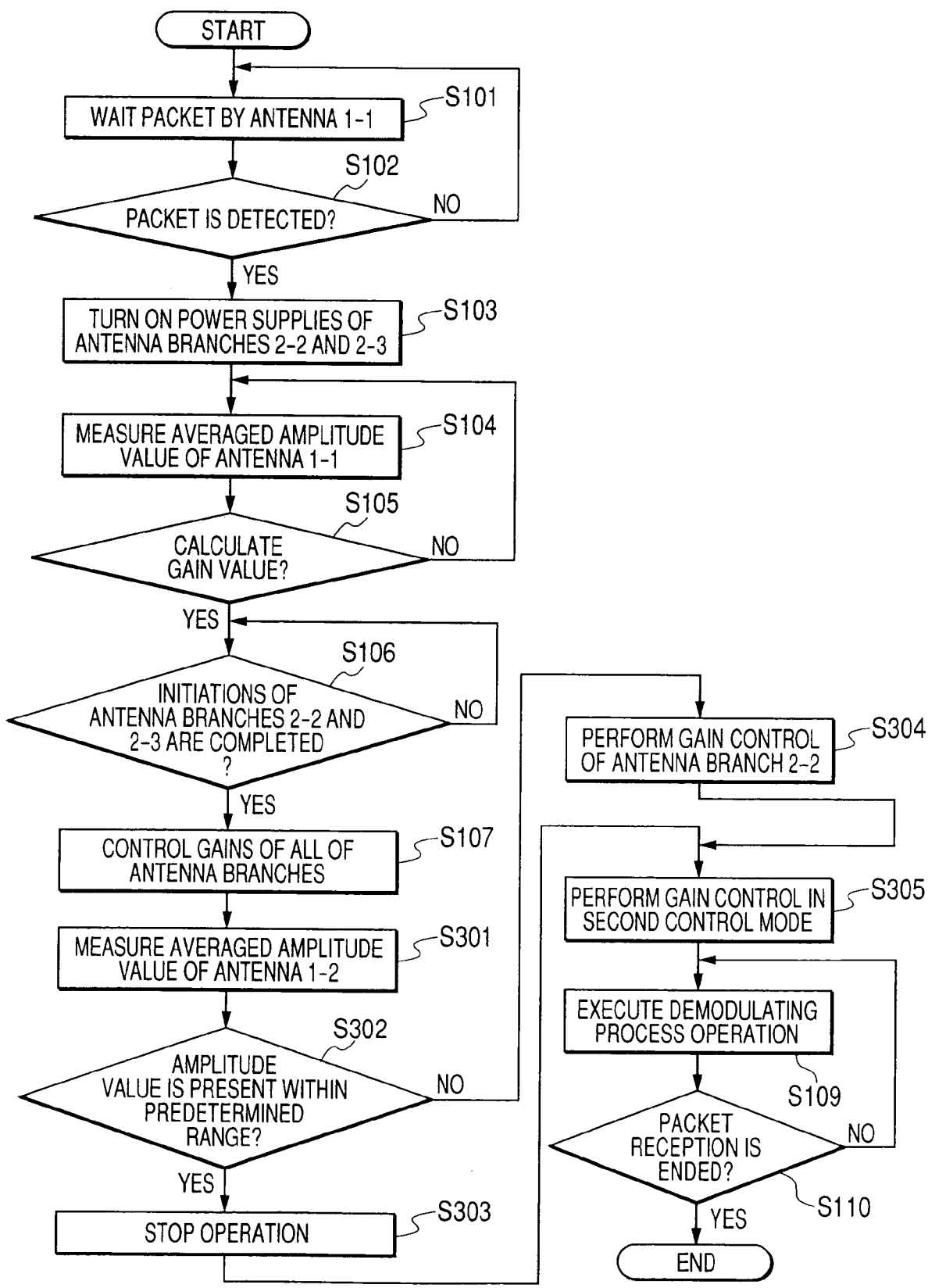
FIG. 13 is an exemplary flow chart for describing operations of a wireless receiving apparatus according to a fourth embodiment of the present invention.
Figure 14:
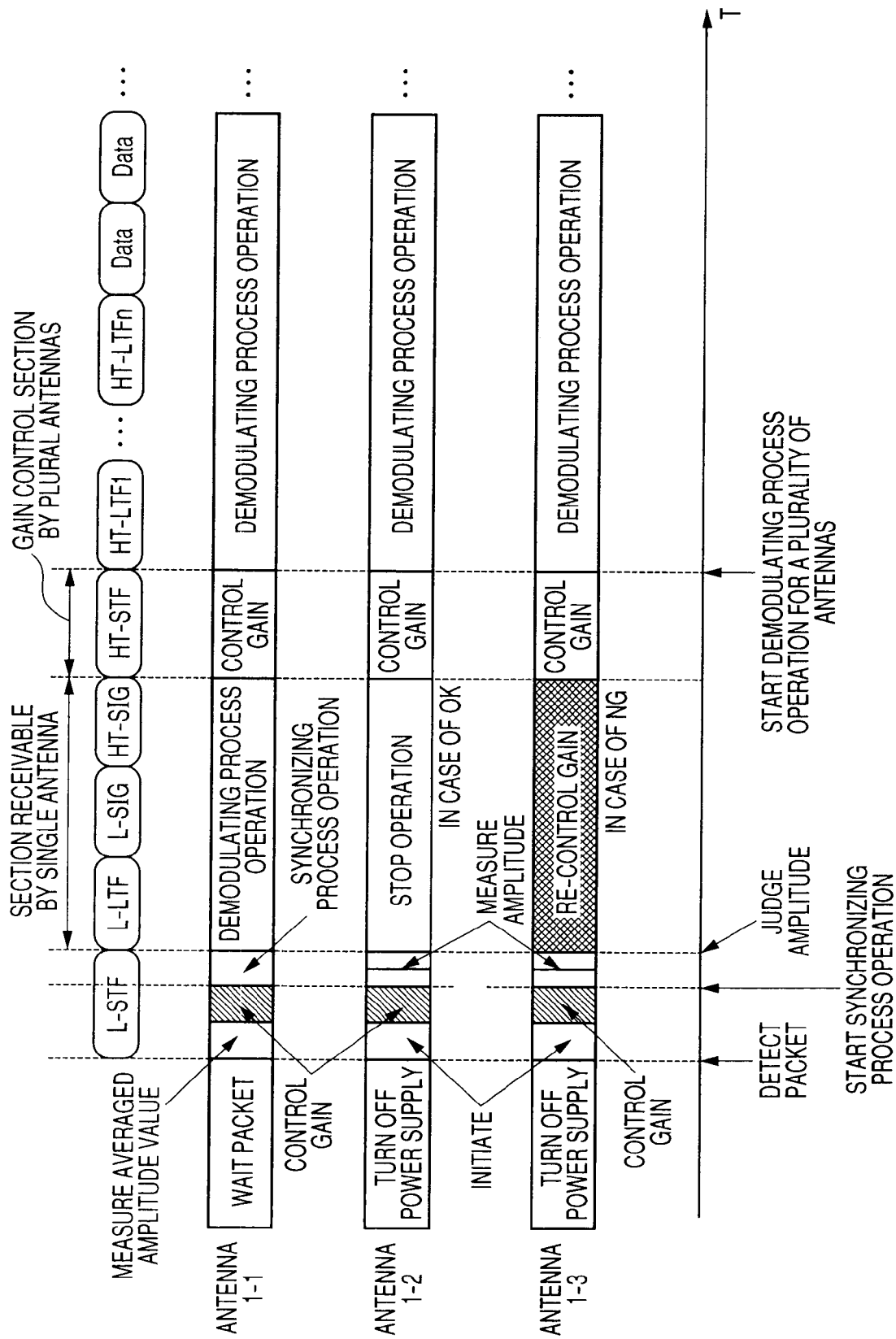
FIG. 14 is an exemplary diagram for representing operation timing of the wireless receiving apparatus when a packet is received, according to the fourth embodiment.

Next, a description is made of a wireless receiving apparatus according to a fourth embodiment of the present invention with reference to FIG. 13 and FIG. 14. Since an arrangement of the wireless receiving apparatus according to the fourth embodiment is the same as that of the wireless receiving apparatus shown in FIG. 1 and FIG. 6, the same reference numerals will be employed as those for indicating the similar structural units, and therefore, descriptions thereof are omitted. Although not shown in the drawing, it is so assumed that the judging units 115-1 to 115-3 shown in FIG. 6 notify judgement results shown in FIG. 1 to the demodulating unit 4.

In the wireless receiving apparatus according to this fourth embodiment, although such a technical idea thereof that the gain control operations are carried out in two stages constructed of the first control mode and the second control mode is identical to the technical idea of the wireless receiving apparatus shown in FIG. 9, the below-mentioned technical idea is different from that of the wireless receiving apparatus shown in FIG. 9. That is, while a synchronizing process operation and a demodulating process operation are carried out based upon a reception signal of a packet waiting antenna, an averaged amplitude value of a reception signal of a packet non-waiting antenna is judged so as to perform gain control operations of the antenna branches 2-2 and 2-3.

Referring now to FIG. 13 and FIG. 14, a description is made of operations of the wireless receiving apparatus according to the fourth embodiment. It should be noted that since operations of the packet waiting antenna 1-1 are similar to those of the wireless receiving apparatus shown in FIG. 9, explanations thereof will be omitted.

FIG. 13 is a flow chart for describing a portion of operations of the wireless receiving apparatus according to this fourth embodiment. FIG. 13 represents operations of the respective units which correspond to the packet non-waiting antenna 1-1 of the wireless receiving apparatus. However, these operations may be similarly applied as to the packet non-waiting antenna 1-3, and also, may be alternatively applied to such a case that the antenna 1-1 corresponding to the packet waiting antenna is a packet non-waiting antenna. It should be noted that since the flow operations until gain control operations of the antenna branches 2-1 to 2-3 are carried out (step S107) are equal to those of the flow chart shown in FIG. 3, explanations thereof will be omitted.

After the gain control operations of the antenna branches 2-1 to 2-3 have been carried out, the amplitude measuring unit 5-2 measures an averaged amplitude value of a signal received via the packet non-waiting antenna 1-2 (step S301). Next, the judging unit 115-2 judges whether or not the averaged amplitude value measured by the amplitude measuring unit 5-2 is converged within a predetermined amplitude range (step S302). When the measured averaged amplitude value is converged within the amplitude range ("YES" in step S302), the demodulating unit 4 stops the demodulating process operation for the reception signal outputted by the antenna branch 2-2 (step S303).

On the other hand, when the measured averaged amplitude value is not converged within the amplitude range ("NO" in step S302), the gain value producing unit 12 calculates a gain control value based upon this averaged amplitude value so as to control the gain of the antenna branch 2-2 (step S304).

The antenna-branch 2-2 in which the demodulating process operation has been stopped and the gain control operation has been performed executes a fine control operation of the gain in the second control mode in the HT-STF section (step S305), and then, executes a demodulating process operation of a packet in the subsequent HT-LTF1 section and succeeding sections thereof (step S109).

Next, a description is made of operation timing of the wireless receiving apparatus according to the fourth embodiment with reference to FIG. 14. It should also be noted that since a structure of a packet shown in an upper stage of FIG. 14 is identical to the structure of the packet indicated in the upper stage of FIG. 8, a description thereof will be omitted. Also, since operation timing as to the packet waiting antenna 1-1, and the packet non-waiting antennas 1-2 and 1-3 until a synchronizing process operation is commenced are identical to the operation timing indicated in FIG. 10, a description thereof will be omitted.

While the synchronizing unit 3 performs a synchronizing process operation based upon a reception signal of the packet waiting antenna 1-1, the amplitude measuring units 5-2 and 5-3 measure averaged amplitude values of signals received via the packet non-waiting antennas 1-2 and 1-3. Next, at such a timing when the process operation is switched from the synchronizing process operation to a demodulating process operation, the judging units 115-2 and 115-3 perform amplitude judging operations of the average amplitude values measured by the amplitude measuring units 5-2 and 5-3. The above-described amplitude judgement is performed in order to judge whether or not the averaged amplitude value is converged within a predetermined amplitude range.

For instance, as indicated in the packet non-waiting antenna 1-2 of FIG. 14, as a result of an amplitude judgement, in such a case that the averaged amplitude value is converged within the amplitude range (in case of OK in this drawing), the demodulating unit 4 stops a demodulating process operation with respect to the output signal of the antenna branch 2-2 until the gain control operation is carried out in the HT-STF section. On the other hand, as indicated in the packet non-waiting antenna 1-3 of FIG. 14, as a result of an amplitude judgement, in such a case that the averaged amplitude value is not converged within the amplitude range (in case of NG in this drawing), a gain control operation is again carried out by employing the L-LTF section to the HT-SIG section.

In this example, the amplitude judging operation is performed at the timing when the process operation is switched from the synchronizing process operation to the demodulating process operation. However, the amplitude judging timing is not limited only to the above-described timing. Alternatively, both the amplitude judging operation may be performed and the gain control operation may be again performed between the synchronizing process operation and the demodulating process operation. It should also be noted that since operation timing after the HT-STF section is identical to the operation timing of the wireless receiving apparatus shown in FIG. 10, a description thereof will be omitted.

As previously described, in the fourth embodiment, a similar advantage to that of the first embodiment can be achieved. In addition, while the synchronizing process operation and the demodulating process operation are carried out based upon the reception signal of the packet receiving antenna 1-1, since the gains of the antenna branches 2-2 and 2-3 are re-controlled based upon the reception signals of the packet non-waiting antennas 1-2 and 1-3, the precision of the gain control operation can be further increased, and also the reception performance of the wireless receiving apparatus can be improved. Also, since the demodulating process operation is stopped with respect to the output signal of the antenna branch 2-2 which does not require to re-control the gain thereof, the power consumption of the wireless receiving apparatus can be reduced.

(Modification 4)

Figure 15:
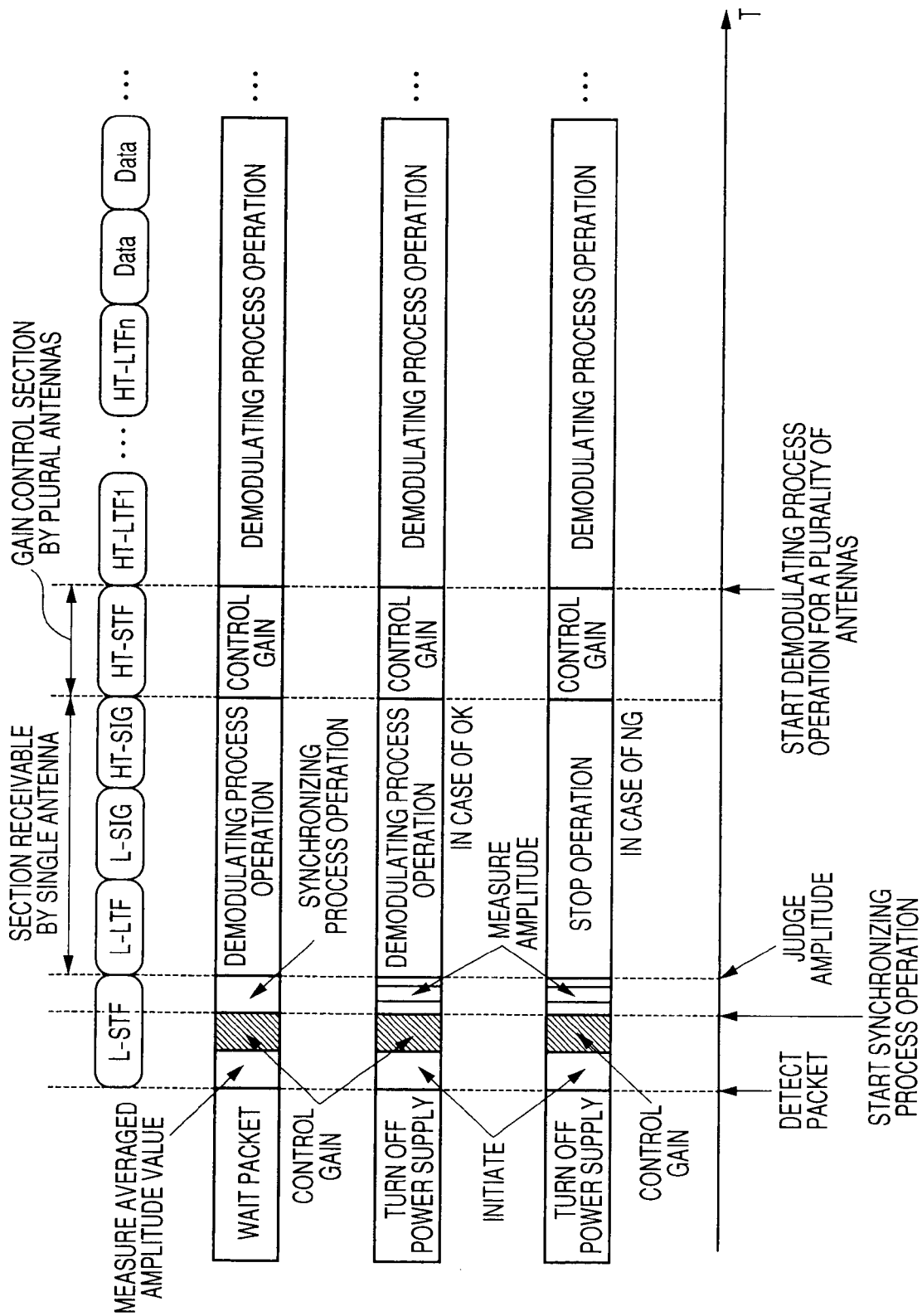
FIG. 15 is an exemplary diagram for indicating operation timing of a wireless receiving apparatus according to a modification 4 of the fourth embodiment.

FIG. 15 shows a modification 4 of the wireless receiving apparatus according to the fourth embodiment. In the above-described fourth embodiment, the demodulating unit 4 has stopped the demodulating process operation of the antenna branch 2-1 whose gain re-control operation is not required within the L-LTF section to the HT-SIG section. In this modification 4, the demodulating process operation for the antenna branch 2-2 is carried out in the L-LTF section to the HT-SIG section in a similar manner to that of the antenna branch 2-1.

The demodulating process operation for the L-LTF section to the HT-SIG section is carried out by employing the reception signal of the packet waiting antenna 1-1, and the reception signal of the packet non-waiting antenna whose gain re-control operation is not required. As a result, the precision of the demodulating process operation for these sections can be improved.

(Modification 5)

In such a case that the executions of the gain control operations are divided into two stages as explained in the wireless receiving apparatuses according to the second embodiment through the fourth embodiment, the gains of both the LNA 213 and the VGAs 216-1 and 216-2 shown in FIG. 2 may be alternatively set.

Figure 16:
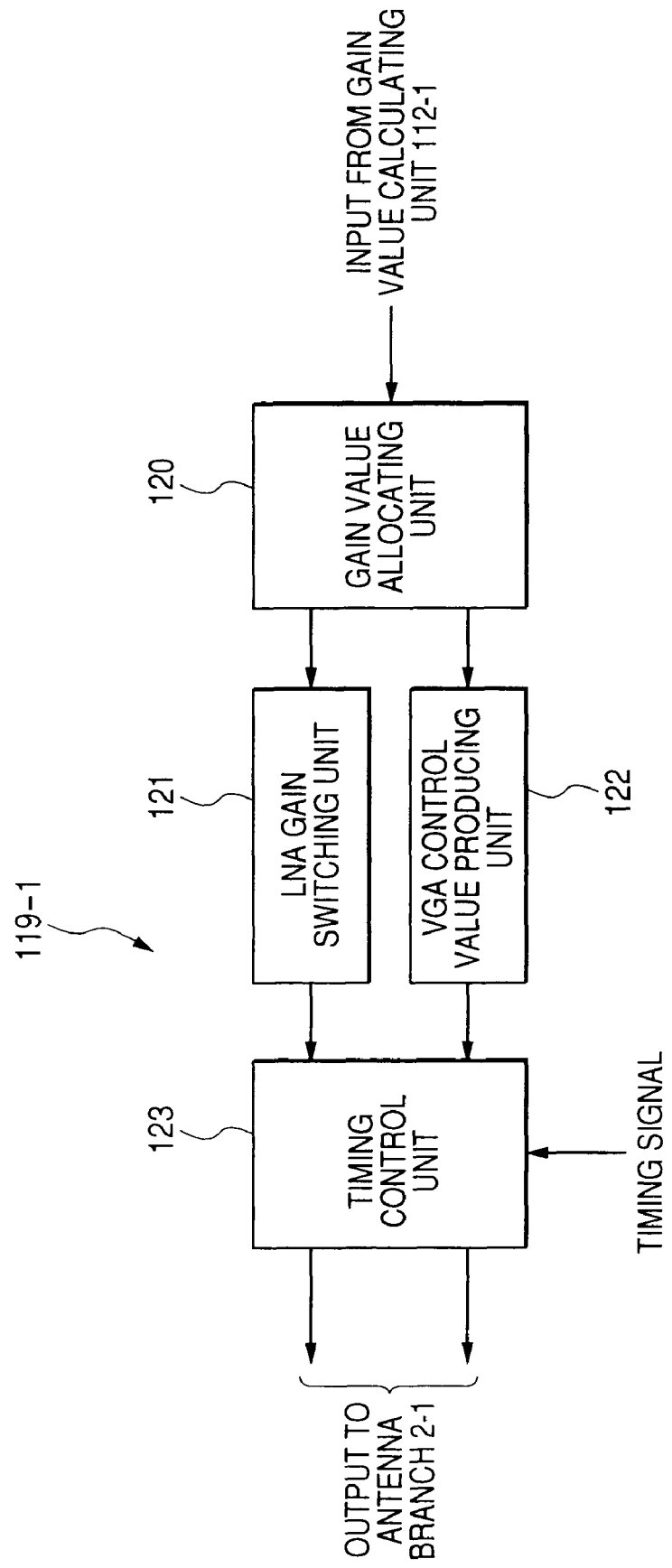
FIG. 16 is an exemplary block diagram for indicating an arrangement of a gain value output control unit 119-1 of a wireless receiving apparatus according to a modification 5 of the fourth embodiment.

FIG. 16 indicates an arrangement of a gain value output control unit 119-1 according to a modification 5. In this modification, although a description is made of the gain value output control unit 119-1 for outputting a gain control value to the antenna branch 2-1, a similar description may be applied to gain value output control units 119-2 and 119-3 for outputting gain control values to the antenna branches 2-2 and 2-3.

The gain value output control unit 119-1 shown in FIG. 16 has included a gain value allocating unit 120, an LNA gain switching unit 121, a VGA control value producing unit 122, and a timing control unit 123.

The gain value allocating unit 120 allocates gain control values calculated by the gain value calculating unit 112-1 to the LNA 213, and the VGAs 216-1 and 216-2. For example, the gain value allocating unit 120 is equipped with such a function that the gain of the LNA 213 is switched by considering that reception power exceeds a certain reception power threshold value, and the gain is fine-controlled by controlling the VGAs 216-1 and 216-2.

The LNA gain switching unit 121 produces a control value of the LNA 213 based upon the gain control value allocated by the gain value allocating unit 120, and outputs the produced control value via the timing control unit 123 to the LNA 213.

The VGA control value producing unit 122 produces control values of the VGAs 216-1 and 216-2 based upon the gain control value allocated by the gain value allocating unit 120, and outputs the produced control values via the timing control unit 123 to the VGAs 216-1 and 216-2.

The timing control unit 123 outputs the control values entered from the LNA gain switching unit 212 and the VGA control value producing unit 122 to the antenna branch 2-1 at such a timing when the gain control is performed based upon the start timing signal inputted from the timing signal producing unit 10.

When a gain re-control operation is carried out, there are some possibilities that a synchronizing process operation and a demodulating process operation are carried out by employing a reception signal of a packet waiting antenna. If the gain of the LNA 213 is controlled, then signals leak into the respective units, so that a large influence may be given to process operations. As a result, it is desirable that the gain of the LNA 213 is not changed. In this case, if the gain value allocating unit 120 judges that the gain is re-controlled based upon notification issued from the gain control mode switching unit 114, then the gain value allocating unit 120 changes a method for allocating the gain values in such a manner that a predetermined gain value is obtained under controls of the VGAs 216-1 and 216-2 without changing the gain of the LNA 213.

As previously explained, when the gain is re-controlled, since the gain of the LNA 213 is not changed, it is possible to suppress a leakage amount of signals from the antenna branches 2-2 and 2-3 whose gains have been changed to the antenna branch 2-1 and a deterioration of reception performance can be suppressed.

Also, when a gain is re-controlled, these are some possibilities that a gain control value produced at a first time is largely different from a gain control value produced at a second time. In this case, while an upper limit of a gain re-control range is predetermined, the gain may be controlled within the gain re-control range.

As a consequence, it is possible to suppress a leakage amount of signals from the antenna branches 2-2 and 2-3 whose gains are re-controlled to the antenna branch 2-1 where the synchronizing process operation and the demodulating process operation are carried out, and a deterioration of the reception performance can be suppressed.

According to the above-mentioned embodiments, even in the system to which the very short preamble has been applied, the lower power consumption during the packet waiting time can be achieved.

It should also be understood that the present invention is not limited only to the above-described embodiments, but may be embodied by modifying the structural elements without departing from the gist of the present invention in embodiment stages. Also, various sorts of wireless receiving apparatuses/methods of the present invention may be alternatively realized by properly combining the plurality of structural elements disclosed in the above-described embodiments. In instance, several structural elements may be alternatively deleted from all of the structural elements described in one embodiment. Furthermore, such structural elements disclosed in different embodiments may be alternatively combined with each other in a proper manner.

What is claimed is:

1. A wireless receiving apparatus comprising:
   a plurality of antennas;
   a plurality of antenna branches connected to the plurality of corresponding antennas each antenna branch capable of receiving a wireless signal and comprising a variable gain amplifying unit;
   a demodulating unit demodulating a reception signal outputted from the antenna branches;
   an antenna selecting unit selecting a packet waiting antenna from the plurality of antennas based upon reception power of the reception signal;
   a packet detecting unit detecting a packet received via the packet waiting antenna;
   a power supply control unit stopping a supply of electric power to a packet non-waiting antenna branch except for the antenna branch connected to the packet waiting antenna until the packet detecting unit detects the packet and supplying electric power to the plurality of antenna branches after the packet detecting unit detects the packet;
   a gain value calculating unit calculating a gain value of the variable gain amplifying unit based upon the reception signal received via the packet waiting antenna; and
   a gain value output control unit controlling a gain of the variable gain amplifying unit based upon the gain value calculated by the gain value calculating unit after the packet non-waiting antenna branch is initiated when the power supply control unit supplies the electric power to the plurality of antenna branches.

2. The wireless receiving apparatus according to claim 1, wherein the packet waiting antenna is an antenna corresponding to an antenna branch whose power supply is under ON condition when the packet can be received, and wherein the packet non-waiting antenna is an antenna corresponding to an antenna branch whose power supply is under OFF condition when the packet can be received.

3. A wireless receiving apparatus as claimed in claim 1, comprising:
   a synchronizing unit performing a synchronizing process operation of the reception signal outputted by the packet waiting antenna after the packet non-waiting antenna is initiated until the demodulating unit starts the demodulating process operation, wherein the gain value output control unit controls the gain of the variable gain amplifying unit of the antenna branch connected to the packet waiting antenna after the power supply control unit supplies the electric power to the plurality of antenna branches, and
   wherein the gain value output control unit controls the gain of the variable gain amplifying unit of the packet non-waiting antenna while the synchronizing unit performs the synchronizing process operation.

4. A wireless receiving apparatus as claimed in claim 1, comprising:
   a synchronizing unit performing a synchronizing process operation of the reception signal outputted by the packet waiting antenna after the packet non-waiting antenna is initiated until the demodulating unit starts the demodulating process operation; and
   a judging unit judging whether or not the gain value output control unit performs a gain re-control operation based upon the reception signal outputted from the packet non-waiting antenna, wherein, when the judging unit judges that the gain re-control operation is carried out, the gain value output control unit calculates the gain value of the variable gain amplifying unit of the packet non-waiting antenna branch based upon the reception signal outputted from the packet non-waiting antenna branch, and
   wherein the gain value output control unit controls the gain of the variable gain amplifying unit of the packet non-waiting antenna branch by employing the gain value calculated by the gain value calculating unit while the synchronizing unit performs the synchronizing process operation.

5. A wireless receiving apparatus, comprising:
   a plurality of antennas;
   a plurality of antenna branches connected to the plurality of antennas corresponding thereto each antenna branch capable of receiving a wireless signal and comprising a variable gain amplifying unit;
   an antenna selecting unit selecting a packet waiting antenna from the plurality of antennas based upon reception power of the reception signal outputted from the plurality of antenna branches;
   a packet detecting unit detecting a packet received via the packet waiting antenna, the packet comprising a first section receivable by one of the plurality of antennas, a second section receivable by the plurality of antennas, and a section capable of controlling a gain of the plurality of antenna branches;

a demodulating unit demodulating a reception signal outputted from the plurality of antenna branches within the first section and the second section;

a power supply control unit stopping a supply of electric power to a packet non-waiting antenna branch except for the antenna branch connected to the packet waiting antenna until the packet detecting unit detects the packet and supplying the electric power to the plurality of antenna branches after the packet detecting unit detects the packet;

a first gain value calculating unit calculating a gain value of the variable gain amplifying unit of the antenna branch based upon the reception signal received via the packet waiting antenna;

a first gain value output control unit controlling a gain of the variable gain amplifying unit by employing the gain value calculated by the first gain value calculating unit after the packet non-waiting is initiated when the power supply control unit supplies the electric power to the plurality of antenna branches;

a second gain value calculating unit calculating the gain value of the variable gain amplifying unit based upon the reception signal received via the plurality of antennas; and a second gain value output control unit controlling the gain value of the variable gain amplifying unit by employing the gain value calculated by the second gain value calculating unit within a third section during which the gain of the plurality of antenna branches of the wireless packet can be controlled.

6. The wireless receiving apparatus according to claim 5, wherein the packet waiting antenna is an antenna corresponding to an antenna branch whose power supply is under ON condition when the packet can be received, and wherein the packet non-waiting antenna is an antenna corresponding to an antenna branch whose power supply is under OFF condition when the packet can be received.

7. A wireless receiving apparatus as claimed in claim 5, comprising:

a synchronizing unit performing a synchronizing process operation of the reception signal outputted by the packet waiting antenna after the packet non-waiting antenna is initiated until the demodulating unit starts the demodulating process operation, wherein the first gain value output control unit controls the gain of the variable gain amplifying unit of the antenna branch connected to the packet waiting antenna after the power supply control unit supplies the electric power to the plurality of antenna branches, and wherein the first gain value output control unit controls the gain value of the variable gain amplifying unit of the packet non-waiting while the synchronizing unit performs the synchronizing process operation.

8. A wireless receiving apparatus as claimed in claim 5, wherein the packet non-waiting antenna branch is initiated while the demodulating unit demodulates the reception signal received by the packet waiting antenna within the first section, and wherein the first gain value output control unit controls the gain of the variable gain amplifying unit of the packet non-waiting antenna branch by employing the gain value calculated by the first gain value calculating unit after the packet non-waiting antenna branch is initiated within the first section.

9. A wireless receiving apparatus as claimed in claim 5, comprising:

a synchronizing unit performing a synchronizing process operation of the reception signal outputted from the packet waiting antenna branch after the packet non-waiting antenna branch is initiated until the demodulating unit starts the demodulating process operation;

an amplitude measuring unit measuring an amplitude value of the reception signal outputted from the packet non-waiting antenna branch while the synchronizing unit performs the synchronizing process operation; and a judging unit judging whether or not the amplitude value measured by the amplitude measuring unit is present within a predetermined range, wherein, within the first section, the second gain value calculating unit calculates a gain value based upon an output signal of the packet non-waiting antenna, whose amplitude value is not present the predetermined range, and wherein the second gain value output control unit controls the gain value of the variable gain amplifying unit of the packet non-waiting antenna whose amplitude value is not present in the predetermined range, based upon the gain value calculated by the second gain value calculating unit.

10. A wireless receiving apparatus as claimed in claim 9, wherein the demodulating unit stops the demodulating operation of the output signal from the packet non-waiting antenna branch whose amplitude is present within the predetermined range within the first section as a judgement result of the judging unit.

11. A wireless receiving method comprising:

amplifying a reception signal which is received via a plurality of antennas by a plurality of antenna branches;

selecting a packet waiting antenna from the plurality of antennas based upon reception power of the reception signal outputted from the plurality of antenna branches;

stopping a supply of electric power to a packet non-waiting antenna branch except for a packet waiting antenna branch connected to the packet waiting antenna;

detecting a packet from the reception signal received via the packet waiting antenna;

supplying electric power of a power supply to the plurality of antenna branches after the packet is detected;

calculating a gain value of a variable gain amplifying unit of at least one of the plurality of antenna branches based upon the reception signal received via the packet waiting antenna; and controlling a gain of the variable gain amplifying unit based upon the calculated gain value after the packet non-waiting antenna branch is initiated when the electric power is supplied to the plurality of antenna branches.

12. A wireless receiving method as claimed in claim 11, comprising:

performing a synchronizing process operation of the reception signal outputted from the packet waiting antenna after the gain of the variable gain amplifying unit are controlled;

judging whether or not a gain control of the variable gain amplifying unit of the packet non-waiting antenna branch are again performed based upon the reception signal outputted from the packet non-waiting antenna branch while the synchronizing process operation is performed;

calculating the gain value of the variable gain amplifying unit based upon the reception signal outputted from the packet non-waiting antenna branch if it is judged that the gain control are again performed while the synchronizing process operation is performed;

controlling the gain of the variable gain amplifying unit of the packet non-waiting antenna branch based upon the calculated gain value while the synchronizing process operation is performed.

13. A wireless receiving method comprising:

amplifying a reception signal which is received via a plurality of antennas by a plurality of antenna branches;

selecting a packet waiting antenna from the plurality of antennas based upon reception power of the reception signal outputted from the plurality of antenna branches;

stopping a supply of electric power to a packet non-waiting antenna branch except for a packet waiting antenna branch connected to the packet waiting antenna;

detecting a packet from the reception signal received via the packet non-waiting antenna;

supplying electric power of a power supply to the plurality of antenna branches after the packet is detected;

calculating a gain value of a variable gain amplifying unit of at least one of the plurality of antenna branches based upon the reception signal received via the packet waiting antenna;

controlling the gain of the variable gain amplifying unit based upon the calculated gain value after the packet non-waiting antenna branch is initiated when the electric power is supplied to the plurality of antenna branches;

demodulating the reception signal outputted from the plurality of antenna branches after the gain of the variable gain amplifying unit is controlled;

calculating the gain value of the variable gain amplifying unit of the antenna branches based upon the reception signal of the plurality of antennas after the reception signal is demodulated;

controlling the gain of the variable gain amplifying unit based upon the calculated gain value; and demodulating the reception signal outputted from the plurality of antenna branches after the gain of the variable gain amplifying unit is controlled.

* * * * *